US006538632B1

(12) United States Patent
Yamazaki et al.

(10) Patent No.: US 6,538,632 B1
(45) Date of Patent: Mar. 25, 2003

(54) THIN FILM TRANSISTOR CIRCUIT AND A SEMICONDUCTOR DISPLAY DEVICE USING THE SAME

(75) Inventors: Shunpei Yamazaki, Tokyo; Jun Koyama, Kanagawa, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/300,133

(22) Filed: Apr. 27, 1999

(30) Foreign Application Priority Data

Apr. 28, 1998 (JP) .......................................... 10-118092
Feb. 25, 1999 (JP) .......................................... 11-048578

(51) Int. Cl.$^7$ ................................................ G09G 3/36
(52) U.S. Cl. ........................... 345/98; 345/92; 330/257; 330/288
(58) Field of Search .......................... 345/98, 100, 204, 345/205, 206, 92; 330/257, 288, 253, 252; 315/169.1–169.3

(56) References Cited

U.S. PATENT DOCUMENTS

| | | | |
|---|---|---|---|
| 4,330,363 A | 5/1982 | Biegesen et al. .............. 156/620 |
| 4,466,179 A | 8/1984 | Kasten .......................... 29/576 |
| 4,797,629 A | * 1/1989 | Wildar .......................... 330/258 |
| 5,145,808 A | 9/1992 | Sameshima et al. ........... 437/173 |
| 5,166,671 A | 11/1992 | Maekawa ...................... 340/784 |
| 5,194,853 A | 3/1993 | Asada ........................... 340/784 |
| 5,247,375 A | 9/1993 | Mochizuki et al. ............. 359/54 |
| 5,250,852 A | 10/1993 | Ovens et al. ................. 307/272.2 |
| 5,264,383 A | 11/1993 | Young ........................... 437/40 |
| 5,327,290 A | 7/1994 | Fukushima et al. ............ 359/692 |

(List continued on next page.)

FOREIGN PATENT DOCUMENTS

| | | |
|---|---|---|
| EP | 0 657 863 | 6/1995 |
| JP | 58-127318 | 7/1983 |
| JP | 59-161014 | 9/1984 |
| JP | 04-282869 | 10/1992 |
| JP | 05-001893 | 1/1993 |
| JP | 05-175235 | 7/1993 |
| JP | 05-203977 | 8/1993 |
| JP | 7-130652 | 5/1995 |
| JP | 7-135318 | 5/1995 |
| JP | 07-162788 | 6/1995 |
| JP | 8-062637 | 3/1996 |
| JP | 8-078329 | 3/1996 |
| JP | 8-172049 | 7/1996 |

OTHER PUBLICATIONS

Yoneda, K. et al, "A Smart Arrangement of TFTs in Low–Temperature Poly–Silicon Circuitry for Achieving Higher Effective Yield in Production," *SID*, L1–L4, 1997.

Yoshida, T. et al, "A Full–Color Thresholdless Antiferroelectric LCD Exhibiting Wide Viewing Angle with Fast Response Time," *SID 97 Digest*, pp. 841–844, 1997.

(List continued on next page.)

*Primary Examiner*—Kent Chang
(74) *Attorney, Agent, or Firm*—Cook, Alex, McFarron, Manzo, Cummings & Mehler, Ltd.

(57) ABSTRACT

To provide thin-film transistor circuits used for a driving circuit that realizes a semiconductor display capable of producing an image with high resolution and high precision without image unevenness.

TFTs with small channel widths are used to form an analog buffer which comprises a differential amplifier circuit and a current mirror circuit and which is used in a driving circuit of an active matrix semiconductor display. A plurality of such analog buffer circuits are connected in parallel to secure an analog buffer that has a sufficient current capacity.

41 Claims, 12 Drawing Sheets

U.S. PATENT DOCUMENTS

| | | | |
|---|---|---|---|
| 5,335,023 A | 8/1994 | Edwards | 348/800 |
| 5,357,290 A | 10/1994 | Horibe | |
| 5,365,875 A | 11/1994 | Asai et al. | 117/7 |
| 5,372,836 A | 12/1994 | Imahashi et al. | 427/8 |
| 5,403,762 A | 4/1995 | Takemura | 437/40 |
| 5,413,958 A | 5/1995 | Imahashi et al. | 437/173 |
| 5,432,122 A | 7/1995 | Chae | 437/101 |
| 5,432,527 A | 7/1995 | Yanai et al. | 345/92 |
| 5,471,225 A | 11/1995 | Parks | 345/98 |
| 5,477,073 A | 12/1995 | Wakai et al. | 257/347 |
| 5,529,630 A | 6/1996 | Imahashi et al. | 118/665 |
| 5,589,406 A | 12/1996 | Kato et al | 437/21 |
| 5,594,569 A | 1/1997 | Konuma et al. | 349/122 |
| 5,597,740 A | 1/1997 | Ito et al. | 437/23 |
| 5,643,826 A | 7/1997 | Ohtani et al. | 437/88 |
| 5,648,277 A | 7/1997 | Zhang et al. | 437/21 |
| 5,680,149 A | 10/1997 | Koyama et al. | 345/98 |
| 5,734,366 A | 3/1998 | Kubota et al. | |
| 5,764,206 A | 6/1998 | Koyama et al. | |
| 5,767,529 A | 6/1998 | Kobori et al. | 257/66 |
| 5,798,742 A | 8/1998 | Watatani et al. | 345/98 |
| 5,808,595 A | 9/1998 | Kubota et al. | 345/92 |
| 5,844,535 A | 12/1998 | Itoh et al. | 345/92 |
| 5,900,854 A | 5/1999 | Itoh et al. | 345/99 |
| 5,923,962 A | 7/1999 | Ohtani et al. | 438/150 |
| 5,942,856 A * | 8/1999 | Koyama | 315/169.3 |
| 5,945,970 A * | 8/1999 | Moon et al. | 345/92 |
| 5,956,581 A | 9/1999 | Yamazaki et al. | |
| 5,990,877 A | 11/1999 | Yeo | 345/204 |
| 6,037,923 A | 3/2000 | Suzuki | 345/92 |
| 6,054,976 A | 4/2000 | Kubota et al. | |
| 6,057,183 A | 5/2000 | Koyama et al. | 438/166 |
| 6,069,605 A * | 5/2000 | Ozawa | 345/98 |
| 6,246,387 B1 | 6/2001 | Yamazaki | 345/92 |
| 6,268,842 B1 * | 7/2001 | Yamazaki et al. | 345/98 |

U.S. PATENT DOCUMENTS

Furue, H. et al, "Characteristics and Driving Scheme of Polymer–Stabilized Monostable FLCD Exhibiting Fast Response Time and High Contrast Ratio with Gray–Scale Capability," *SID*, P–78, 1998.

English abstract re Japanese Patent Application No. JP 7–130652.

English abstract re Japanese Patent Application No. JP 7–135318.

English abstract re Japanese Patent Application No. JP8–062637.

English abstract re Japanese Patent Application No. JP8–078329.

English abstract re Japanese Patent Application No. JP 8–172049.

JP 05–001893 English abstract.

JP 07–162788 English abstract.

U.S. patent application No. 09/986,742 (pending) including specification, claims, abstract, and drawings.

M. Bonnel, et al., "Polycrystalline Silicon Thin–Film Transistors with Two–Step Annealing PRocess," IEEE Electron Device Letters, vol. 14, No. 12, (1993) 551–553.

I. Fujieda, et al., "Self–Referenced Poly–Si TFT Amplifier Readout for a Linear Image Sensor," IEDM, (1993) 551–553.

M. Fuse, et al., "Performance of Poly–Si Thin Film Transistors Fabricated by Excimer–Laser Annealing of SiH–and SiH–Source Low Pressure vapor Deposited a–Si Films with or without Solid–Phase Crystallization,"Solid State Phenomena, 37–38 (1994) 565–570.

Ohtani, et al., "LP–B: Late–News Poster: A 60–in. HDTV rear–Projector with Continuous–Grain–Silicon Technology," SID 98 Digest, (1998) 467–470.

European patent application no. 83302004.3 to Sakurai filed Aug. 4, 1983, including specification, claims, abstract drawings.

* cited by examiner

CMOS CIRCUIT | PIXEL MATRIX CIRCUIT

THIN FILM TRANSISTOR CIRCUIT AND A SEMICONDUCTOR DISPLAY DEVICE USING THE SAME

BACKGROUND OF THE INVENTION

The present invention relates to a driving circuit for a semiconductor display device using thin-film transistors. More specifically, the invention relates to a thin-film transistor circuit which uses a differential amplifier circuit and a current mirror circuit and which is used in a driving circuit for an active-matrix type semiconductor display. The invention also relates to a semiconductor display device using the thin-film transistor circuits.

A technology for manufacturing thin-film transistors (TFT) using a semiconductor film formed on an inexpensive glass substrate has advanced rapidly in recent years. This is because there are growing demands for active matrix liquid crystal displays and EL displays. The active matrix liquid crystal display has a TFT disposed in each of several tens to several millions of pixel areas arranged in matrix and controls electric charges coming into or going out of individual pixel electrodes by the switching function of the TFTs.

FIG. 11 shows a configuration of a conventional active matrix liquid crystal display device. A shift register and a buffer circuit are generally called a driving circuit and are in recent years formed on the same substrate as the active matrix circuit. Denoted 1101 is a source signal line side driving circuit and 1102 a gate signal line side driving circuit.

Designated 1103 is an active matrix circuit (pixel matrix circuit) which has pixels TFT 1104 arranged in matrix. Each pixel TFT 1104 has its drain electrode connected to a pixel electrode. Between these pixel electrodes and counter electrodes is sandwiched and sealed liquid crystal. The pixel TFTs 1104 are each formed with an auxiliary capacitor 1106 to hold charge.

A technology is also known which uses quartz as a substrate and manufactures thin-film transistors using a polycrystalline silicon film.

Another technology is also known which utilizes a laser anneal method to manufacture thin-film transistors using crystalline silicon film on a glass substrate.

In the configuration shown in FIG. 11, a timing signal from the shift register circuit of the source signal line side driving circuit selects an image signal supplied to an image line, and the selected image signal is fed to the corresponding source signal line. Further, a timing signal from the gate signal line side driving circuit is supplied to the corresponding gate signal line (scan line). The image signal fed to the source signal line is written into the pixel electrode of the thin-film transistor selected by the timing signal from the gate signal line.

This operation is repeated by setting an appropriate timing to successively write information into each pixel arranged in matrix.

After image information for one screen (one frame) has been written, the writing of image information for the next screen is performed. In this way, images are displayed one after another. Normally, the writing of image information for one screen is performed 30 or 60 times a second.

FIG. 12 shows one example of the source signal line side driving circuit. Reference number 1200 represents a clock input terminal, 1201 a clock line, 1202 a start pulse input terminal, 1203–1205 shift registers, 1206–1211 inverter type buffers, 1212 a video signal input terminal, 1213 a video signal line, 1214–1216 and 1220–1222 switches, 1217–1219 and 1225–1227 storage capacitors, 1223 a transfer signal input terminal, 1224 a transfer signal input line, 1228–1230 analog buffers, and 1231–1233 source signal line connection terminals.

In the case of an analog gray scale, a gray scale signal entered into the source signal line side driving circuit uses a video signal which is continuous in time. In the case of a normally white mode (a display mode that displays a white color when the liquid crystal is not impressed with a voltage), a setting is made such that the displayed color approaches black as the absolute value of the voltage of the gradation signal increases. To the shift registers 1203–1205, a start pulse is applied in synchronism from the start pulse input terminal 1202, with the video signal and are shifted by a clock pulse entered from the clock pulse line. The outputs of the shift registers 1203–1205 are fed through the inverter type buffers 1206–1211 to a sampling circuit.

The sampling circuit comprises switches 1214–1216 and storage capacitors 1217–1219.

Here, one example of a conventional circuit used as analog buffers 1228–1230 is shown in FIG. 13. Designated 1301 is a terminal connected with a storage capacitor and used as a signal input terminal (IN). Denoted 1302 is a terminal connected with a source signal line and used as a signal output terminal (OUT). Reference numeral 1303 represents a constant current source, 1304 a constant voltage source, 1305 and 1306 P-channel TFTs, and 1307 and 1308 N-channel TFTs. In the analog buffer of FIG. 13, the differential circuit comprises P-channel TFTs and the current mirror circuit comprises N-channel TFTs.

The operation of the analog buffer of FIG. 13 will be described. When the voltage of the input terminal (IN) 1301 of the differential circuit connected to the storage capacitor increases, the input current of the current mirror circuit connected to the opposite phase output of the input terminal (IN) 1301 decreases and the output current of the current mirror circuit also decreases correspondingly. On the other hand, the current of the same phase of the input terminal increases, causing the voltage of the output terminal (OUT) 1302 to rise to the same voltage level as the input terminal of the differential circuit. Therefore, the voltage of the source signal line connected to the output terminal (OUT) 1302 becomes equal to that of the input terminal.

In recent years, as the amount of information handled increases sharply, efforts have been made to increase the display capacity and enhance the resolution of the display. Examples of computer display resolutions for some standards are shown below in terms of pixel numbers.

Pixel number (horizontal×vertical): Standard

640×640: EGA

640×480: VGA

800×600: SVGA

1024×768: XGA

1280×1024: SXGA

Recent years have seen the spread of software even in a personal computer field that performs a plurality of displays which are different in nature. This gives rise to a trend that a growing number of displays are compatible with XGA and SXGA standards that have higher resolutions than VGA and SVGA.

The active matrix liquid crystal displays are very frequently used in the field of notebook type personal computer. In recent years, they have come to be used not only in the notebook type personal computer but often as the displays of desktop personal computers.

In addition to the display of data signals in personal computers, the active matrix liquid crystal displays with high resolutions have come to be used for displaying television signals.

The buffers or analog buffers in the active matrix liquid crystal display devices used for such displays are not useful if their current capacity is small, and thus are required to have a certain magnitude of current capacity. When buffers or analog buffers with a large current capacity are made using thin-film transistors, the TFTs with a large current capacity, i.e., with a large channel width, are necessary. However, the TFTs with a large channel width have variations in the crystallinity among devices, which in turn causes variations in threshold voltage among TFTs. Hence, there are necessarily variations in the characteristic of the buffer or analog buffer made of a plurality of TFTs. This means that buffers or analog buffers have characteristic variations among individual source signal lines, and these characteristic variations will lead to variations in voltage applied to the pixel matrix circuit, which in turn will cause display unevenness on the entire display screen.

When the TFT size (channel width) is too large, in some cases, only the central part of TFT functions as a channel, with end portions not working as channels, thus accelerating the deterioration of TFTs.

Further, when the TFT size is large, the heat of the TFT itself increases, causing variations and degradations in the threshold.

In the gate signal line side driving circuit, too, a scanning signal is successively supplied to the gate signal line (scanning line) according to the timing signal from the shift register. The digital driving circuit that performs a sequential line driving must drive all pixel TFTs connected to one scanning line and thus the load capacitor connected to one scanning line is large. Therefore, the gate signal line side driving circuit is also required to pass the timing signal from the shift register through the buffer circuit or the like to eliminate dulling. In this case also, a buffer with a large current capacity is needed, which raises a problem described above. Particularly because the buffer of the gate signal line is required to drive all the TFTs in the pixel matrix circuit connected to one line, the characteristic variations will cause significant image unevenness. This is one of the most serious problems in the way to realizing high-precision, high-definition displays.

In recent years, attentions are being focused on a technology in which the semiconductor thin film is made polycrystalline by applying a laser beam against the semiconductor thin film formed on a substrate. With this technology, it is possible to impart a high level of energy that equals to a thermal anneal only to a desired localized area, offering the advantage that the whole substrate does not have to be subjected to high temperature.

Particularly a technology that renders a semiconductor thin film polycrystalline by using a pulse oscillation laser such as an excimer laser, is drawing attention. This method throws a laser pulse of large energy against the semiconductor thin film to instantly melt the semiconductor thin film, which then grows crystals as it solidifies.

There is another method which is being spotlighted. This method changes the shape of the laser beam into a linear shape longer in width than the substrate to be processed and scans this beam relatively to the substrate. The word scan here refers to irradiating the linear laser beam while shifting it so that the scanned paths overlap each other.

The above technique that applies a linear pulse laser beam while shifting it and overlapping the scanned paths, however, produces lines or stripes on the surface of the laser-irradiated semiconductor thin film. These stripes have great adverse effects on the characteristics of the thin-film transistors formed on the semiconductor thin film or on devices that will be formed on the semiconductor thin film. When analog buffers used for the driving circuits are to be formed, in particular, their characteristics need to be uniform as mentioned above, and thus the linear stripes pose a serious problem. In this case, within each of the stripes, characteristic is uniform but there are characteristic variations among different stripes.

Even in an anneal method using a linear laser beam, the uniformity of laser irradiation effect constitutes an issue. The high uniformity referred to here means that similar device characteristics are obtained wherever on the substrate the devices are formed. To enhance the uniformity is to make uniform the crystallinity of the semiconductor material. For enhanced uniformity, the following steps are taken.

To alleviate nonuniformity of the laser irradiation effect, it has been found that applying a weak pulse laser beam as a preliminary step (hereinafter referred to as a preliminary irradiation) before using a stronger pulse laser beam (hereinafter referred to as a main irradiation) improves the uniformity. This is very effective in suppressing variations and improving the characteristics of the semiconductor device circuits.

Why the preliminary irradiation is effective in maintaining the uniformity of the film is that the film of the semiconductor material containing amorphous portions described above has a property such that its laser energy absorption factor differs significantly from those of the polycrystalline and single crystal films. In other words, the mechanism of the two-step irradiation is that the first irradiation crystallizes the amorphous portions remaining on the film and the second irradiation promotes the overall crystallization. By slowly effecting the crystallization in this way, it is possible to suppress to a certain extent the stripe-like variations produced on the semiconductor material by the application of a linear laser beams. This countermeasure substantially improves the uniformity of the laser beam irradiation effect, making the stripe pattern relatively inconspicuous.

However, when a large number (several millions to several tens of millions) of thin-film transistors need to be formed on a glass substrate for an active matrix semiconductor display, such as a liquid crystal display, even the above-mentioned two-step laser irradiation method is not satisfactory in terms of the uniformity of irradiation effect.

It is therefore an object of the present invention to solve the problems described above and to provide a thin-film transistor circuit used in a driving circuit for a semiconductor display device that can produce a good image with high precision and high resolution and without image unevenness.

SUMMARY OF THE INVENTION

This invention provides analog buffers with a sufficiently large current capacity by using TFTs with a small channel width in making analog buffers, which is used for the driving circuit of an active matrix semiconductor display and comprises a differential amplifier circuit and a current mirror circuit, and by connecting a plurality of these circuits in parallel.

According to one aspect of the invention, a thin-film transistor circuit is provided which comprises n analog buffer circuits (n is a natural number equal to or greater than 2) connected in parallel, each of the n analog buffer circuits having a differential circuit and a current mirror circuit. This achieves the objects described herein.

According to one aspect of the invention, a thin-film transistor circuit according to claim 1 is provided, wherein a plurality of thin-film transistors forming the differential circuit and a plurality of thin-film transistors forming the current mirror circuit are arranged within the same shot of a linear pulse laser beam. This achieves the objects described herein.

According to one aspect of the invention, a thin-film transistor circuit according to claim 1 or 2 is provided, wherein a direction of carrier movement in the plurality of thin-film transistors is about 45 degrees to a direction of scan of the linear pulse laser beam. This achieves the objects described herein.

According to one aspect of the invention, a thin-film transistor circuit is provided which comprises n analog buffer circuits, each of the n analog buffer circuits having:

a differential circuit having a thin-film transistor on an input side and m thin-film transistors on an output side, the m thin-film transistors having gates, sources and drains thereof at their respective common voltages; and a current mirror circuit having a thin-film transistor on the input side and m thin-film transistors on the output side, the m thin-film transistors having gates, sources and drains thereof at their respective common voltages. This achieves the objects described herein.

The input side thin-film transistor and the m output side thin-film transistors in the differential circuit of each of the n analog buffer circuits and the input side thin-film transistor and the m output side thin-film transistors in the current mirror circuit of each of the n analog buffer circuits may be arranged within the same shot of a linear pulse laser beam, respectively.

A direction of carrier movement in the thin-film transistors may be set at about 45 degrees to a direction of scan of the linear pulse laser beam.

According to one aspect of the invention, a semiconductor display device is provided which comprises:

a pixel matrix circuit;

a source signal line side driving circuit; and a gate signal line side driving circuit;

wherein the source signal line side driving circuit having a thin-film transistor circuit having n analog buffer circuits (n is a natural number equal to or greater than 2) connected in parallel, each of the n analog buffer circuits having a differential circuit and a current mirror circuit. This achieves the objects described herein.

A plurality of thin-film transistors forming the differential circuit and a plurality of thin-film transistors forming the current mirror circuit may be arranged within the same shot of a linear pulse laser beam, respectively.

A direction of carrier movement in the plurality of thin-film transistors may be set at about 45 degrees to a direction of scan of the linear pulse laser beam.

According to one aspect of the invention, a semiconductor display device is provided which comprises:

a pixel matrix circuit;

a source signal line side driving circuit; and a gate signal line side driving circuit;

wherein the source signal line side driving circuit having a thin-film transistor circuit comprising n analog buffer circuits, each of the n analog buffer circuits having:

a differential circuit having a thin-film transistor on an input side and m thin-film transistors on an output side, the m thin-film transistors having gates, sources and drains thereof at their respective common voltages; and a current mirror circuit having a thin-film transistor on the input side and m thin-film transistors on the output side, the m thin-film transistors having gates, sources and drains thereof at their respective common voltages. This realizes the objects described herein.

The input side thin-film transistor and the m output side thin-film transistors in the differential circuit of each of the n analog buffer circuits and the input side thin-film transistor and the m output side thin-film transistors in the current mirror circuit of each of the n analog buffer circuits may be arranged within the same shot of a linear pulse laser beam, respectively.

A direction of carrier movement in the thin-film transistors may be set at about 45 degrees to a direction of scan of the linear pulse laser beam.

DETAILED DESCRIPTION OF THE PRESENTLY PREFERRED EMBODIMENTS

Figure 1:
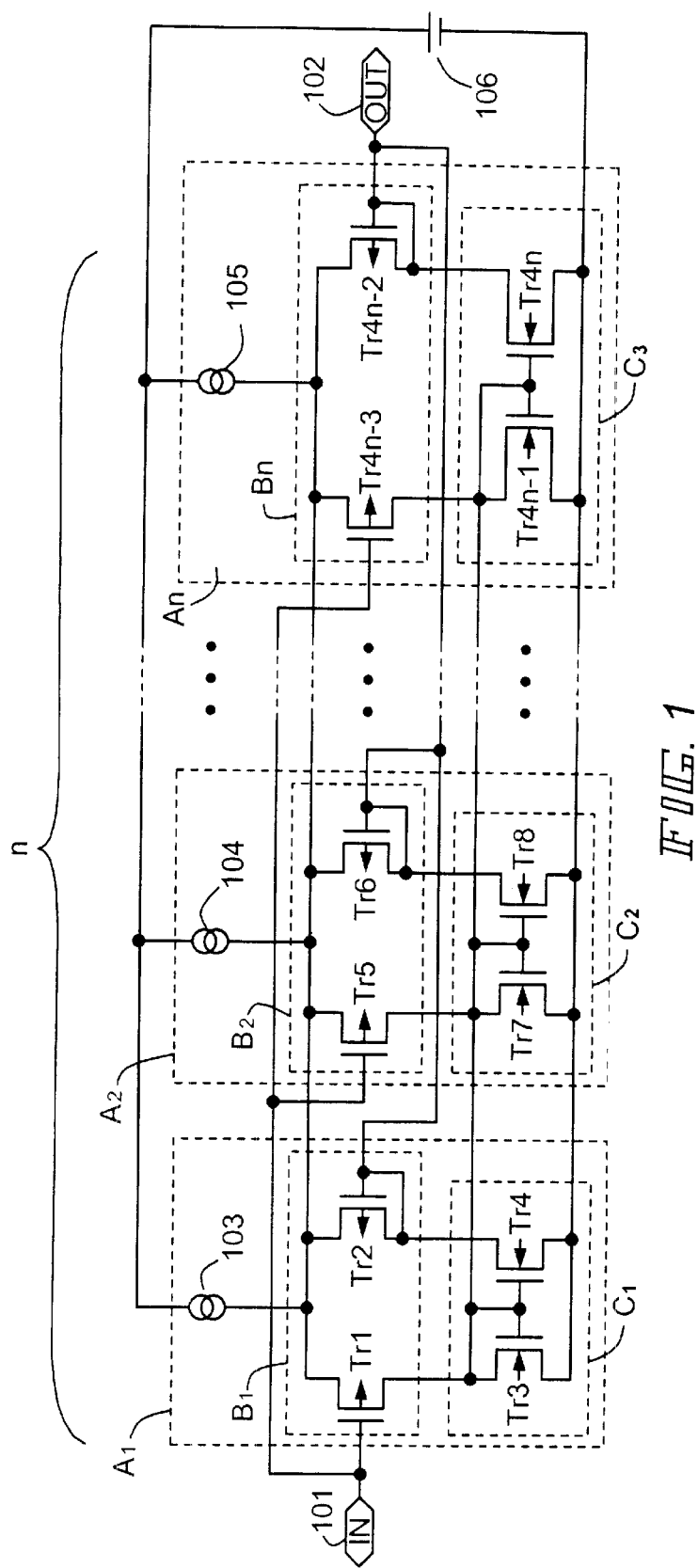
FIG. 1 is a diagram showing a circuit configuration of an analog buffer circuit of the invention.

This invention will be explained by referring to FIG. 1. FIG. 1 shows a circuit configuration of the analog buffer circuit, which is a thin-film transistor circuit of the invention. The analog buffer circuit of the invention has analog buffer circuits A1–An connected in parallel (n is a natural number equal to or larger than 2). The analog buffer circuits A1–An all have the same circuit configuration. Thus, the analog buffer circuit of the invention can be said to have a configuration comprising n analog buffer circuits A1 connected in parallel.

The analog buffer circuit A1 has a differential circuit B1 and a current mirror circuit C1.

The differential circuit B1 has P-channel TFTs on the input and output sides (Tr1 (on input side) and Tr2 (on output side)). A gate electrode of Tr1 is connected to the input terminal (IN) 101 and a gate electrode of Tr2 is connected to the output terminal (OUT). A connecting point between source or drain of Tr1 and source or drain of Tr2 is connected to a constant current source 103. The gate electrode of Tr2 is connected to either source or drain, that is the other one of the source or drain connected to the constant current source 103.

The current mirror circuit C1 has N-channel TFTs on the input and output sides (Tr3 (on input side) and Tr4 (on output side)). A connecting point between source or drain of Tr3 and source or drain of Tr4 is connected to a constant voltage source 106. A gate electrode of Tr3 and a gate electrode of Tr4 are connected together. The gate electrodes of Tr3 and Tr4 are connected to either source or drain of Tr3 which is the other one of the source or drain connected to the source or drain of Tr4 (or connected to the constant voltage source 106).

The other one of source or drain of Tr1 connected to the constant current source 103 is connected to the other one of source or drain of Tr3 connected to Tr4 (or connected to the constant voltage source 106). The other one of source or drain of Tr2 connected to the constant current source 103, is connected to the other one of source or drain of Tr4 connected to Tr3 (or connected to the constant voltage source 106). In this way, the differential circuit B1 and the current mirror circuit C1 are connected.

An analog buffer circuit A2 has a differential circuit B2 and a current mirror circuit C2 in the same way as does the analog buffer circuit A1.

The differential circuit B2 has P-channel TFTs on the input and output sides (Tr5 (on input side) and Tr6 (on output side)). A gate electrode of Tr5 is connected to the input terminal (IN) 101 and a gate electrode of Tr6 is connected to the output terminal (OUT) 102. A connecting point between source or drain of Tr5 and the source or drain of Tr6 is connected to a constant current source 104. The gate electrode of Tr6 is connected to its source or drain, which is opposite its source or drain connected to the constant current source 104.

The current mirror circuit C2 has N-channel TFTs on the input and output sides (Tr7 (on input side) and Tr8 (on output side)). A connecting point between source or drain of Tr7 and source or drain of Tr8 is connected to a constant voltage source 106. A gate electrode of Tr7 and a gate electrode of Tr8 are connected together. The gate electrodes of Tr7 and Tr8 are connected to the other one of source or drain of Tr7 connected to Tr8.

The other one of drain or source of Tr5 connected to the constant current source 104, is connected to the other one of source or drain of Tr7 connected to Tr8 (or connected to the constant voltage source 106). The other one of source or drain of Tr6 connected to the constant current source 104, is connected to the other one of source or drain of Tr8 connected to the source or drain of Tr7 (or connected to the constant voltage source 106). In this way, the differential circuit B2 and the current mirror circuit C2 are connected.

An analog buffer circuit An has a differential circuit Bn and a current mirror circuit Cn in the same way as do the analog buffer circuits A1, A2.

The differential circuit Bn has P-channel TFTs on the input and output sides (Tr4n-3 (on input side) and Tr4n-2 (on output side)). A gate electrode of Tr4n-3 is connected to the input terminal (IN) 101 and a gate electrode of Tr4n-2 is connected to the output terminal (OUT) 102. A connecting point between source or drain of Tr4n-3 and source or drain of Tr4n-2 is connected to a constant current source 105. The gate electrode of Tr4n-2 is connected to its source or drain, which is opposite its source or drain connected to the constant current source 105.

The current mirror circuit Cn has N-channel TFTs on the input and output sides (Tr4n-1 (on input side) and Tr4n (on output side)). A connecting point between the source or drain of Tr4n-1 and the source or drain of Tr4n is connected to a constant voltage source 106. A gate electrode of Tr4n-1 and a gate electrode of Tr4n are connected together. The gate electrodes of Tr4n-1 and Tr4n are connected to the other one of source or drain of Tr4n-1 that is connected to the source or drain of Tr4n (or connected to the constant voltage source 106).

The other one of source or drain of Tr4n-3 connected to the constant current source 105, is connected to the other one of source or drain of Tr4n-1 connected to Tr4n (or connected to the constant voltage source 106). The other one of source or drain of Tr4n-2 connected to the constant current source 105, is connected to the other one of source or drain of Tr4n connected to Tr4n-1 (or connected to the constant voltage source 106). In this way, the differential circuit Bn and the current mirror circuit Cn are connected.

The circuit configurations of analog buffers A3 to An-1 (not shown) are also similar to those of the analog buffers A1, A2 and An.

As described above, the analog buffer circuit of the invention comprises n analog buffer circuits connected in parallel. As for the TFTs making up the analog buffer circuit of the invention, those with a relatively small channel width (100 $\mu$m or less (preferably 90 $\mu$m or less)), rather than those with a large channel width, are used. This can prevent characteristic variations of TFTs and thus reduce characteristic variations of the analog buffer circuit. Furthermore, this can realize an analog buffer circuit with a large current capacity.

The polarities of the thin-film transistors used in the differential circuit and the current mirror circuit are opposite. In FIG. 1, the differential circuit uses P-channel thin-film transistors and the current mirror circuit uses N-channel thin-film transistors. The polarities of P- and N-channel transistors may be reversed. It is noted, however, that they do not operate if their polarities are the same.

When the active matrix liquid crystal display using the analog buffer circuit of the invention is to be fabricated by the laser technology mentioned earlier, it is possible to further reduce the characteristic variations of the analog buffer circuit as described below.

When the analog buffer of the invention shown in FIG. 1 is used, the differential circuits B1–Bn are arranged so that they are included in the same pulse of the linear laser beam, and the current mirror circuits C1–Cn are arranged likewise to be included in the same pulse of the linear laser beam. The semiconductor film made polycrystalline by the same pulse of the linear laser beam is known to have small characteristic variations. With this arrangement, the characteristic variations of the analog buffer circuit can be minimized further. Furthermore, both the differential circuits B1–Bn and the current mirror circuits C1–Cn may be arranged to be included in the same pulse of the linear laser beam.

Further it is also possible to arrange (pattern) the analog buffer circuit so that direction of active layer of TFTs making up the analog buffer circuit, or the direction of movement of carriers, is inclined to the linear laser beam scan direction, i.e., the direction perpendicular to the line.

When the analog buffer circuit is arranged so that the TFT active layer is inclined to the scan direction of the linear laser beam, it is known that the characteristic variations of individual TFTs decrease. Hence, this arrangement can further reduce variations of the analog buffer characteristic that directly affects the image quality.

The invention will be described in detail in conjunction with the following embodiments. It should be noted that the following embodiments are only example implementations of the invention and that the invention is not limited to these embodiments (Embodiment 1)

In this embodiment, a case where the analog buffer of the invention is applied to the source signal line side driving circuit of an active matrix liquid crystal display will be described. The analog buffer of the invention can also be used for the gate signal line side driving circuit. The number of pixels in the active matrix liquid crystal display of this embodiment is 1024 horizontal×768 vertical.

Figure 2:
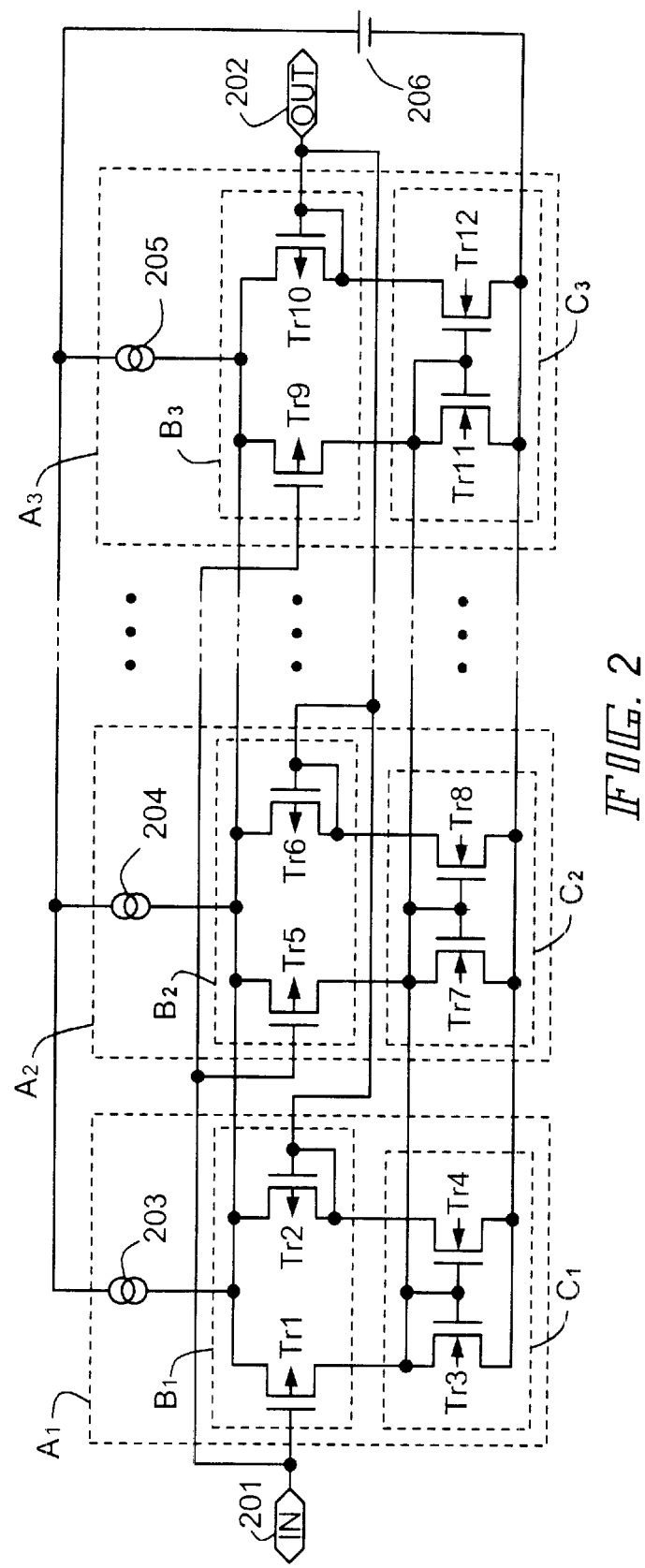
FIG. 2 is a diagram showing a circuit configuration of an analog buffer circuit of the invention.

FIG. 2 will be referred. FIG. 2 shows a circuit configuration of the analog buffer circuit of this embodiment. The analog buffer circuit of this embodiment has three analog buffer circuits A1–A3 connected in parallel (n=3). The analog buffer circuits A1–A3 each has a differential circuit and a current mirror circuit. The analog buffer circuits A1–A3 are similar to the above-described circuit configuration having n analog buffer circuits connected in parallel, in that each of the analog buffer circuits is connected to an input terminal (IN) 201 and an output terminal (OUT) 202 and also to constant current sources 203–205 and a constant voltage source 206.

The analog buffer circuit A1 has a differential circuit B1 and a current mirror circuit C1. P-channel TFTs (Tr1 and Tr2) making up the differential circuit B1 have a channel width of 30 $\mu$m and N-channel TFTs (Tr3 and Tr4) forming the current mirror circuit C1 have a channel width of 30 $\mu$m.

As to the analog buffer circuit A2 and analog buffer circuit A3, the same also holds. The P-channel TFTs forming these circuits (Tr5, Tr6, Tr9 and Tr10) have a channel width of 30 m and the N-channel TFTs (Tr7, Tr8, Tr1 and Tr12) have a channel width of 30 $\mu$m.

While in this embodiment the number of TFTs forming the differential circuit is set equal to that of the TFTs forming the current mirror circuit, they do not have to be the same. Although the channel widths of the P-channel TFTs or N-channel TFTs are set to 30 m, they need only to be set equal to or smaller than 100 $\mu$m (preferably equal to or smaller than 90 $\mu$m).

In this embodiment, the analog buffer circuit is made by connecting in parallel three analog buffer circuits each comprising TFTs with relatively small channel widths. Hence, compared with a case where the analog buffer circuit is formed of only one analog buffer circuit, the size of a plurality of TFTs (channel width) making up each of the three analog buffer circuits needs only to be one-third. Thus, the arrangement of this embodiment can minimize the self-heating of TFTs and therefore prevent change or degradation of threshold values of the TFTs which would otherwise occur due to self-heating. If one or two of the three analog buffer circuits A1–A3 forming the analog buffer circuit should fail, the remaining two or one analog buffer circuit remains operational, thereby improving yields of the product.

By using a plurality of TFTs with small channel widths to form the analog buffer which directly affects the image quality of the active matrix liquid crystal display and by securing a necessary capacity, it is possible to reduce characteristic variations and self-heating, enhance reliability and minimize deterioration.

One example method of manufacturing an active matrix liquid crystal display having the analog buffer of this embodiment in a driving circuit will be explained. The manufacturing method described below is only one example to implement the present invention, and other manufacturing methods may be used to realize the active matrix liquid crystal display having thin-film transistor circuits of the invention.

Here, an example case of forming a plurality of TFTs on a substrate having an insulated surface to form a pixel matrix circuit, a driving circuit, a logic circuit, etc. in a monolithic manner is shown in FIGS. 3 to 6. This embodiment shows how one pixel of the pixel matrix circuit and a CMOS circuit, which is a basic circuit of other circuits (such as a driving circuit and a logic circuit both having the analog buffers of the invention) are formed simultaneously on the same substrate. Further, although this embodiment describes the manufacturing process for a case where the P-channel TFT and the N-channel TFT each have one gate electrode, the similar process can also be applied to the CMOS circuit made of TFTs having a plurality of gate electrodes, such as double gate or triple gate type TFTs.

Referring to FIG. 3, a quartz substrate 301 is prepared as a substrate having an insulated surface. It is also possible to use a silicon substrate formed with a thermal oxide film, rather than the quartz substrate. Further, another method may be used which temporarily forms an amorphous silicon film over the quartz substrate and thermally oxidizes it completely to form an insulating film. It is also possible to use a quartz substrate or ceramics substrate formed with a silicon nitride film as an insulating film.

An amorphous silicon film 302 is formed over the substrate 301 by a low pressure CVD method, plasma CVD method or sputtering method. The amorphous silicon film 302 is adjusted so that its final thickness (a thickness considering a thickness reduction after thermal oxidation) will be 10–100 nm (preferably 30–60 nm). It is important during the film forming process to perform a comprehensive control on concentrations of impurities in the film.

While in this embodiment the amorphous silicon film 302 is formed over the substrate 301, other semiconductor films may be used instead of the amorphous silicon film. For example, a compound of silicon and germanium, expressed as $Si_xGe_{1-X}$ (0<X<1), may be used.

In this embodiment, the process is controlled so that the concentrations of C (carbon) and N (nitrogen)—impurities that hinder crystallization—in the amorphous silicon film 302 are both less than $5 \times 10^{18}$ atoms/cm$^3$ (typically, $5 \times 10^{17}$ atoms/cm$^3$ or less or preferably $2 \times 10^{17}$ atoms/cm$^3$ or less) and that the concentration of O (oxygen) is less than $1.5 \times 10^{19}$ atoms/cm$^3$ (typically, $1 \times 10^{18}$ atoms/cm$^3$ or less or preferably $5 \times 10^{17}$ atoms/cm$^3$). This is because, if these impurities exist at concentrations higher than these levels, they will adversely affect the subsequent crystallization process and degrade the film quality after crystallization. In this specification, the in-film impurity concentrations of these elements described above are defined by minimum values of measurements taken by SIMS (secondary ion mass spectrometry).

To realize the above requirements, the low pressure thermal CVD furnace used in this embodiment should preferably be dry-cleaned periodically to keep the film depositing chamber clean. The dry cleaning is done by feeding 100–300 sccm of $ClF_3$ (chlorine fluoride) gas into the furnace heated to about 200–400° C. so that the film depositing chamber is cleaned with a fluorine gas generated by thermal decomposition.

According to the findings obtained by the applicant of this invention, when the in-furnace temperature is set at 300° C. and 300 sccm of $ClF_3$ (chlorine fluoride) gas is supplied, an adhering material about 2 mm thick (mainly composed of silicon) can be removed completely in four hours.

The hydrogen concentration in the amorphous silicon film 302 is a very important parameter. It seems that a film with good crystallinity can be obtained by keeping the hydrogen content low. It is therefore preferred that the amorphous silicon film 302 is formed by the low pressure thermal CVD. The plasma CVD may also be used by optimizing the film depositing condition.

During the process of forming the amorphous silicon film 302, it is effective to add an impurity element (13-group elements, typically boron, or 15-group elements, typically phosphorus) to control the threshold voltage (Vth) of TFTs. The amount to be added should be determined by considering the Vth obtained when the Vth controlling impurities are not added.

Next, the process of crystallizing the amorphous silicon film 302 is performed. As crystallization means the technology disclosed by Japanese Patent Application Laid-Open Heisei 7-130652 is used. Either an embodiment 1 or an embodiment 2 in the official gazette may be used. It is preferred in this embodiment, however, to use the technology disclosed by the embodiment 2 (which is detailed in Japanese Patent Application Laid-Open Heisei 8-78329). U.S. Pat. No. 5,643,826 corresponds to the Japanese Patent Application Laid-Open Heisei 7-130652. The contents disclosed in these Japanese patent applications and U.S. patent are incorporated herein by reference.

The technology described in Japanese Patent Application Laid-Open Heisei 8-78329 first forms a mask insulation film 303 that selects areas to which a catalytic element is to be added. The mask insulation film 303 has a plurality of openings for adding the catalytic element. The positions of the openings determine the positions of crystal areas.

Figure 3A:
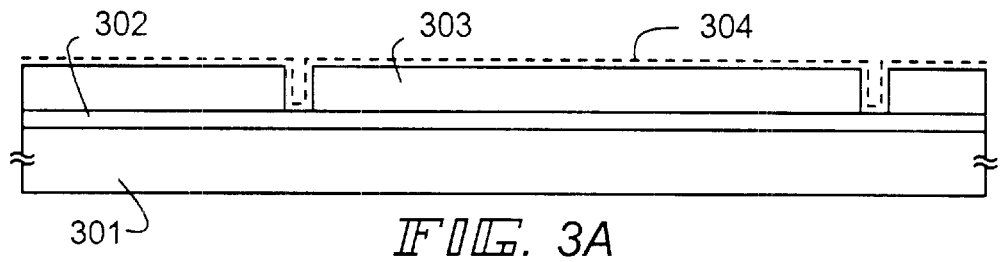
FIG. 3 is a diagram showing a process of manufacturing an active matrix liquid crystal display having an analog buffer circuit of the invention.

Then, a solution containing nickel (Ni) as a catalytic element that promotes crystallization of amorphous silicon film is applied by spin coating to form a Ni containing layer 304. In addition to nickel, the catalytic element may include cobalt (Co), iron (Fe), palladium (Pd), germanium (Ge), platinum (Pt), copper (Cu), gold (Au), etc. (FIG. 3A).

The process of adding the catalytic element may use ion implantation using a resist mask or plasma doping. In this case, the reduction of the doped areas and the control of growth distance of the horizontal growth areas become easy. Hence, this is an effective technology when forming miniaturized circuits.

Next, after the catalytic element adding process is finished, hydrogen is removed at 500° C. for about 2 hours. After this, under an inert atmosphere, hydrogen atmosphere or oxygen atmosphere the substrate is heated at a temperature of 500–700° C. (typically 550–650° C. or preferably 570° C.) for 4–24 hours to crystallize the amorphous silicon film 302. In this embodiment, the heating process is performed at 570° C. in a nitrogen atmosphere for 14 hours.

Figure 3B:
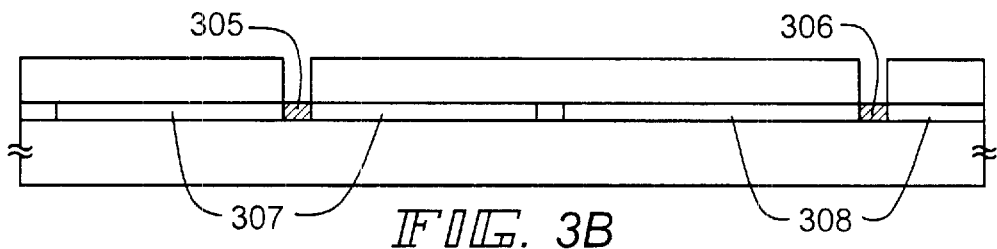

At this time, the crystallization of the amorphous silicon film 302 begins preferentially from nuclei that are generated in the regions 305 and 306 doped with nickel, thus forming crystal areas 307 and 308 that have grown almost in parallel with the surface of the substrate 301. These crystal areas 307 and 308 are called lateral growth areas. Because the lateral growth areas have an aggregate of crystals scattered relatively uniformly, it has an advantage of excellent overall crystallinity (FIG. 3B).

When the technology described in the embodiment 1 of the Japanese Patent Application Laid-Open Heisei 7-130652 is used, an area that can be called a lateral growth area is also formed microscopically. However, nucleus generation occurs nonuniformly in the plane and thus there is a problem in terms of controlling the grain boundary.

Figure 3C:
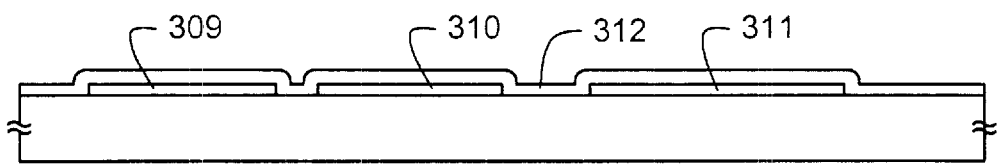

After the heating process for crystallization is complete, the mask insulation film 303 is removed and a patterning process is performed to form island-shaped semiconductor layers (active layers) 309, 310, 311 made of the lateral growth areas 307 and 308 (FIG. 3C).

Denoted 309 is an active layer of an N-channel TFT forming a CMOS circuit, 310 an active layer of a P-channel TFT forming a CMOS circuit, and 311 an active layer of an N-channel TFT (pixel TFT) forming a pixel matrix circuit.

After the active layers 309, 310, 311 have been formed, a gate insulation film 312 containing silicon is formed over the active layers (FIG. 3C).

Figure 3D:
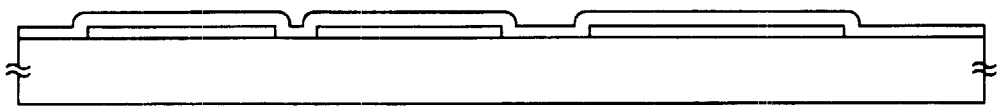

Then, as shown in FIG. 3D, the substrate is heated to remove or reduce the catalytic element (nickel) (a catalytic element gettering process). This heating process mixes a halogen element in the processing atmosphere to utilize the gettering effect of the halogen element on the metal element.

To obtain a sufficient gettering effect of the halogen element, the heating process should preferably be performed at a temperature in excess of 700° C. Below this temperature, decomposition of halogen compounds in the processing atmosphere becomes difficult, and that may make it impossible to obtain a desired gettering effect.

In this embodiment, therefore, the heating process is performed at a temperature in excess of 700° C., preferably 800–1000° C. (typically 950° C.), for 0.1–6 hours, typically 0.5–1 hour.

In this embodiment, an example case of heating the substrate at 950° C. for 30 minutes in an oxygen atmosphere containing 0.5–10 vol % of hydrogen chloride (in this embodiment 3 vol %) will be explained. Setting the HCl density higher than this level is not desirable because it forms unevenness on the surface of about the film thickness of the active layers 309, 310, 311.

Although HCl gas is used as a compound containing halogen elements, other gases may be used. For example, it is possible to use one or more of halogen containing compounds such as HF, $NF_3$, HBr, Cl2, $ClF_3$, $BCl_2$, $F_2$ and $Br_2$.

In this process, nickel in the active layers 309, 310, 311 is considered to be removed by the gettering action of chlorine and released into an open air in the form of volatile nickel chloride. This process reduces the nickel concentration in the active layers 309, 310, 311 below $5 \times 10^{17}$ atoms/$cm^3$.

The value of $5 \times 10^{17}$ atoms/$cm^3$ is the lower limit of detection by the SIMS (secondary ion mass spectrometry). The analysis of TFTs fabricated by the applicant of this invention shows that no nickel effect on the TFT characteristic was observed for the nickel concentration of $1 \times 10^{18}$ atoms/$cm^3$ or lower (preferably $5 \times 10^{17}$ atoms/$cm^3$ or lower). However, the impurity concentrations in this specification are defined by the minimum values of measurements taken by the SIMS analysis.

At the interface between the active layers 309, 310, 311 and the gate insulation film 312, a thermal oxidation reaction proceeds by the heating process described above, increasing the thickness of the gate insulation film 312 by a thickness of the thermally oxidized film. Forming the thermally oxidized film in this way can produce a semiconductor/insulation film interface with a very low interface state. It also has an effect of preventing failure of formation of thermally oxidized film at the end of the active layer (edge thinning).

It may be effective to perform the catalytic element gettering process after removing the mask insulation film 303 before patterning the active layer. The catalytic element gettering process may also be performed after the active layer is patterned. It is also possible to combine any of these gettering processes.

The catalytic element gettering process can be performed by using P (phosphorus). The gettering process using phosphorus may be combined with the above-mentioned gettering process. It is also possible to use only the gettering process using phosphorus.

Further, performing the heating process at 950° C. for about 1 hour in a nitrogen atmosphere following the heating process in the halogen atmosphere is also effective in improving the film quality of the gate insulation film 312.

The SIMS analysis has found that the halogen elements that were used for the gettering process remain in the active layers 309, 310, 311 at a concentration of $1 \times 10^{15}$ atoms/cm$^3$ to $1 \times 10^{20}$ atoms/cm$^3$. It is also confirmed by the SIMS analysis that the halogen elements are distributed at high concentrations between the active layers 309, 310, 311 and the thermally oxidized film formed by the heating process.

The SIMS analysis has also found that the concentrations of representative impurities, C (carbon), N (nitrogen), O (oxygen) and S (sulfur), are below $5 \times 10^{18}$ atoms/cm$^3$ (typically $1 \times 10^{18}$ atoms/cm$^3$ or lower).

The lateral growth areas of the active layers obtained in this manner exhibit a peculiar crystal structure consisting of an aggregate of bar-like or flat bar-like crystals. The features of this peculiar crystal structure will be described later.

Next, let us turn to FIG. 4. First, a metal film not shown which is made mainly of aluminum is formed, and then prototypes of gate electrodes 313, 314, 315 are formed by patterning. In this embodiment an aluminum film containing 2 wt % of scandium is used (FIG. 4A).

Instead of the aluminum film containing 2 wt % of scandium, a polysilicon film injected with impurities may be used as gate electrodes.

Figure 4A:
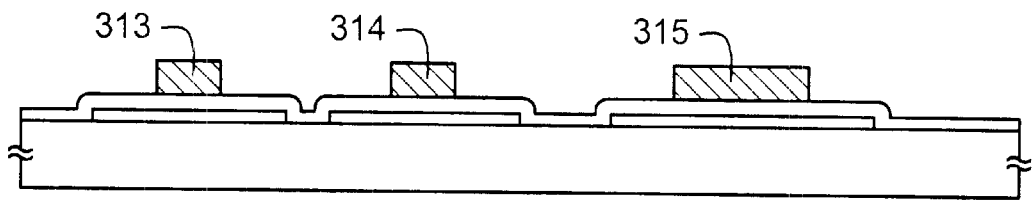
FIG. 4 is a diagram showing a process of manufacturing an active matrix liquid crystal display having an analog buffer circuit of the invention.
Figure 4B:
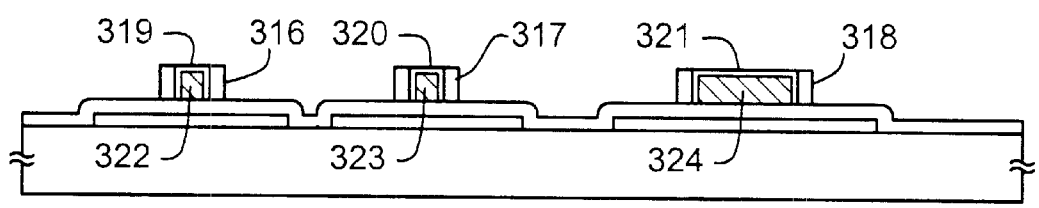

Next, by using a technology described in Japanese Patent Application Laid-Open Heisei 7-135318, porous anode oxide films 316, 317, 318, nonporous anode oxide films 319, 320, 321, and gate electrodes 322, 323, 324 are formed (FIG. 4B).

Figure 4C:
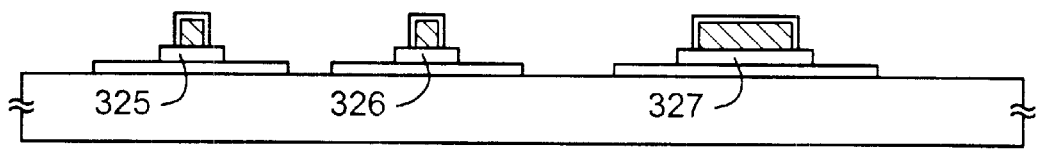

After the state of FIG. 4B is obtained, the gate insulation film 312 is etched away, with the gate electrodes 322, 323, 324 and porous anode oxide films 316, 317, 318 used as masks. Then, the porous anode oxide films 316, 317, 318 are removed to obtain the state of FIG. 4C. In FIG. 4C, denoted 325, 326 and 327 are gate insulation films after the process.

Next, an impurity element for giving a conductivity is added. The impurity element may include P (phosphorus) or As (arsenic) for N-channel type and B (boron) or Ga (gallium) for P-channel type.

In this embodiment, the impurity injection processes for forming the N-channel and P-channel TFTs are each performed in two steps.

First, an impurity is added for forming the N-channel TFTs. A first impurity injection (using P (phosphorus) in this embodiment) is performed at a high acceleration voltage of about 80 keV to form an n– region. An adjustment is made of the impurity injection so that the P-ion concentration in the n– region will be $1 \times 10^{18}$ atoms/cm$^3$ to $1 \times 10^{19}$ atoms/cm$^3$.

A second impurity injection is carried out at a low acceleration voltage of about 10 keV to form an n+ region. Because the acceleration voltage is low, the gate insulation film works as a mask. An adjustment is made so that a sheet resistance of the n+ region is 500 Ω or less (preferably 300 Ω or less).

With the above steps taken, a source region 328, a drain region 329, low concentration impurity regions 330, and a channel formation region 331 of an N-channel TFT of the CMOS circuit are formed. Further, a source region 332, a drain region 333, low concentration impurity regions 334, and a channel formation region 335 of an N-channel TFT forming a pixel TFT are defined (FIG. 4D).

Figure 4D:
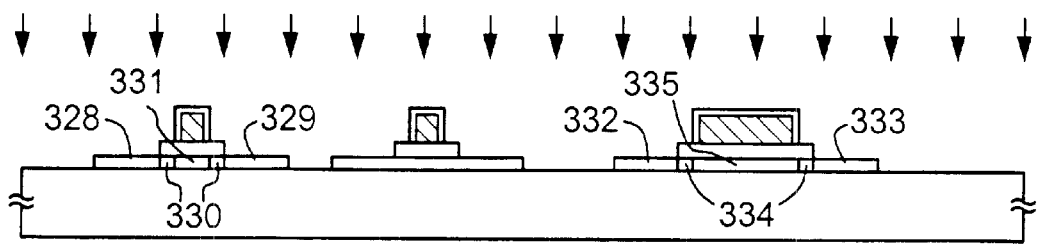

In the state shown in FIG. 4D, the active layer of the P-channel TFT forming the CMOS circuit has the same structure as the active layer of the N-channel TFT.

Figure 5A:
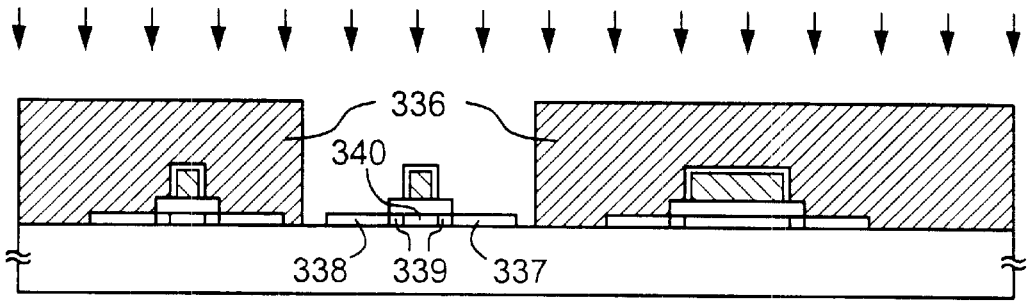
FIG. 5 is a diagram showing a process of manufacturing an active matrix liquid crystal display having an analog buffer circuit of the invention.

Next, as shown in FIG. 5A, a resist mask 336 is deposited over the N-channel TFTs and impurity ions for giving P-type conductivity are injected (in this embodiment boron is used).

This process is also performed in two steps as in the preceding impurity injection process. In this case, because the N-channel type must be inverted into the P-channel type, B (boron) is added in a concentration several times higher than that of the P (phosphorus) ions.

Thus, a source region 337, a drain region 338, low concentration impurity regions 339 and a channel formation region 340 of a P-channel TFT of a CMOS circuit are formed (FIG. 5A).

After the active layer is completed as described above, the impurity ions are activated by a combination of furnace anneal, laser anneal, lamp anneal, etc. At the same time, damages in the active layer sustained during the injection process are repaired.

Next, a laminated films consisting of a silicon oxide film and a silicon nitride film are formed as an inter-layer insulation film 341. After contact holes are formed, source electrodes 342, 343, 344 and drain electrodes 345, 346 are formed to obtain the state shown in FIG. 5B. An organic resin film may also be used as the inter-layer insulation film 341.

Figure 5B:
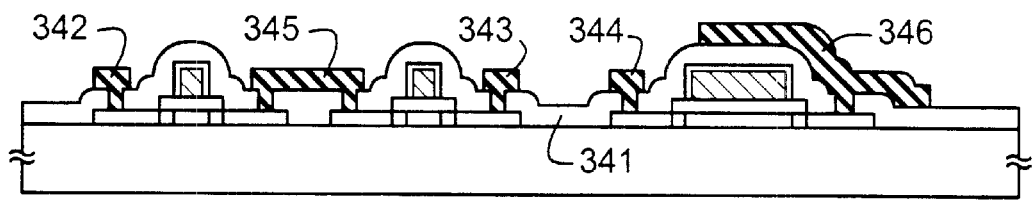

After the state shown in FIG. 5B is obtained, a first inter-layer insulation film 347 made of organic resin film is formed to a thickness of 0.5–3 μm. The organic resin film may include polyimide, acrylics and polyimide amide. Among the advantages of the organic resin film are the ease with which the film can be made, the ability to increase the film thickness easily, the ability to reduce parasitic capacitance because of its low relative permittivity, and an excellent planarity. Other organic resin films than mentioned above may also be used.

Next, a black matrix 348 made of a light shielding film is formed over the first inter-layer insulation film 347 to a thickness of 100 nm. In this embodiment, a titanium film is used as the black matrix 348 but a resin film containing black pigment may be used.

When a titanium film is used for the black matrix 348, a part of the driving circuit and other peripheral circuits can be formed of titanium. The titanium wiring is formed simultaneously with the black matrix 348.

Figure 5C:
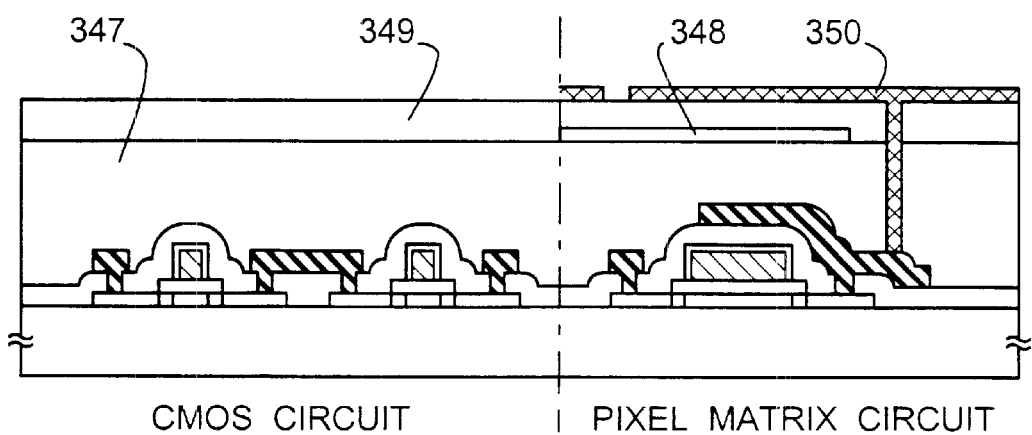

After the black matrix 348 is formed, one of a silicon oxide film, a silicon nitride film and an organic resin film or a laminated film of these is formed as a second inter-layer insulation film 349 to a thickness of 0.1–0.3 μm. Then, contact holes are formed in the inter-layer insulation film 347 and the inter-layer insulation film 349. A pixel electrode 350 is formed to a thickness of 120 nm. In the constituent of this embodiment, an auxiliary capacitor is formed in areas where the black matrix 348 and the pixel electrode 350 overlap each other (FIG. 5C). This embodiment is an example of a transmission type active matrix liquid crystal display and thus a transparent conductive film such as ITO is used as a conductive film that forms the pixel electrode 350.

Next, the substrate as a whole is heated at 350° C. in a hydrogen atmosphere for 1–2 hours to hydrogenate the entire device and thereby compensate for dangling bonds in a film (specially in an active layer). With these processes performed, the CMOS circuit and the pixel matrix circuit can be fabricated on the same substrate.

Figure 6:
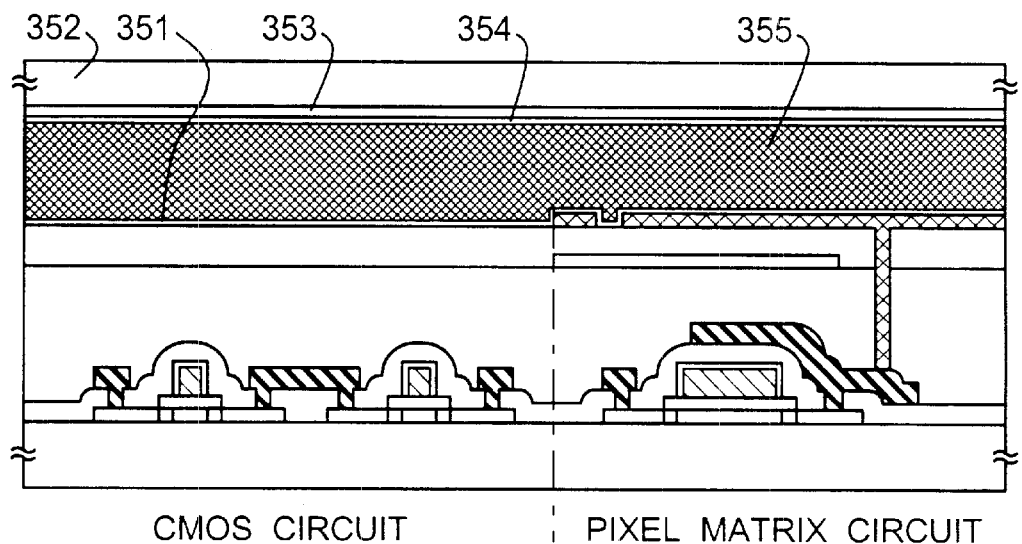
FIG. 6 is a cross section of an active matrix liquid crystal display having an analog buffer circuit of the invention.

Next, by referring to FIG. 6, the process of manufacturing an active matrix liquid crystal display using the active matrix substrate fabricated as described above will be explained.

An alignment film 351 is formed over the active matrix substrate in the state of FIG. 5C. This embodiment uses polyimide for the alignment film 351. Next, a counter substrate is prepared. The counter substrate comprises a glass substrate 352, a transparent conductive film 353 and an alignment film 354.

This embodiment uses as an alignment film such a polyimide film as will orientate the liquid crystal molecules parallel to the substrate. After the alignment film is formed, a rubbing process is performed to orientate liquid crystal molecules in parallel at a predetermined pre-tilt angle.

Next, the active matrix substrate and the counter substrate, which have undergone the above processes, are bonded together with seal members and spacers (neither of them shown) interposed, by the known cell assembly process. Then, a liquid crystal material 355 is injected between the two substrates and completely sealed by a sealant (not shown). Thus, a transmissive type active matrix liquid crystal display as shown in FIG. 6 is completed.

Figure 7:
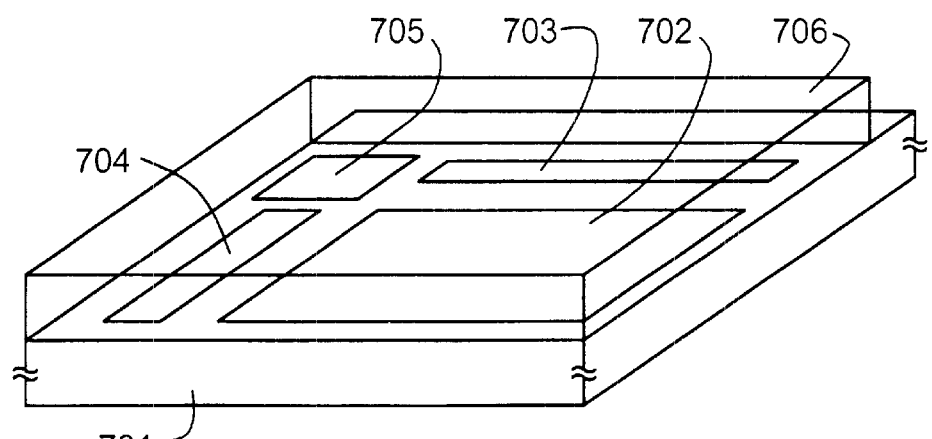
FIG. 7 is a perspective view of an active matrix liquid crystal display having an analog buffer circuit of the invention.

FIG. 7 shows a perspective view of a completed active matrix liquid crystal display. Reference number 701 represents an active matrix substrate, 702 a pixel matrix circuit, 703 a source signal line side driving circuit, 704 a gate signal line side driving circuit, 705 other peripheral circuits, and 706 a counter substrate. As shown in FIG. 7, the active matrix liquid crystal display device of this embodiment has projected to the outside only one end face of the active matrix substrate to which FPC is attached, with the remaining three end faces aligned.

In this embodiment, the liquid crystal display performs display in a TN (twisted nematic) mode. Hence, a pair of polarizers (not shown) are disposed in a crossed-Nicols arrangement (a pair of polarizers are arranged with their polarizing axes crossing each other at right angles) and hold the liquid crystal panel therebetween.

Thus, when not applied with a voltage, it is understood that the liquid crystal display of this embodiment shows a white color, i.e., it performs an image display in a so-called normally white mode.

With the manufacturing method described above, it is understood that the active matrix liquid crystal display device of this embodiment has the driving circuit, other peripheral devices and pixels integrally formed over an insulation substrate such as quartz substrate and glass substrate.

When the polycrystallization of the semiconductor thin film is done by a linear laser beam, this manufacturing method arranges the differential circuits B1–B3 in a manner to include in the same pulse of the linear laser and also arranges the current mirror circuits C1–C3 in a manner to include in the same pulse of the linear laser beam. The semiconductor thin film that is rendered polycrystalline by the same pulse of the linear laser is known to have small characteristic variations. With this method the characteristic variations of the analog buffer circuit can be minimized further. It is also possible to have both the differential circuits B1–B3 and the current mirror circuits C1–C3 included in the same pulse of the linear laser beam.

(Embodiment 2)

Figure 8:
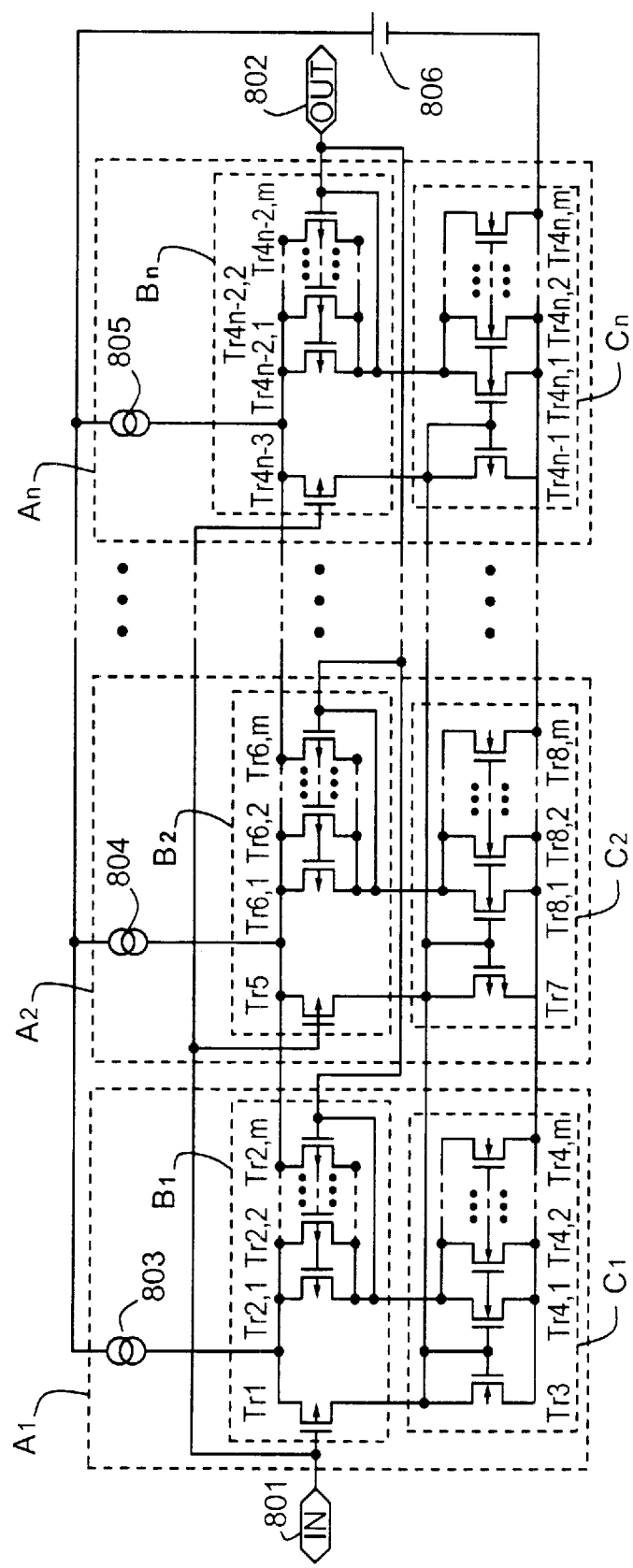
FIG. 8 is a diagram showing a circuit configuration of an analog buffer circuit of the invention.

FIG. 8 shows another embodiment of the invention. FIG. 8 represents a case where the constituent of this invention is used for the analog buffer circuit of the source signal line side driving circuit of the active matrix semiconductor display. In this embodiment, the number of thin-film transistors on the output side of the differential circuits and the current mirror circuits is increased by m times (m is a natural number equal to or larger than 2). In other words, the number of circuits on the output side of the differential circuits and the current mirror circuits is multiplied by m. This is done to enhance the current capability of the analog buffer circuit.

The analog buffer circuit of this embodiment has n analog buffer circuits A1–An (n is a natural number equal to or larger than 2). This circuit is identical to the previous circuit configuration in that n analog buffer circuits are connected in parallel.

An analog buffer circuit A1 has a differential circuit B1 and a current mirror circuit C1.

The differential circuit B1 has a P-channel TFT (Tr1) on the input side and P-channel TFTs (Tr2,1, Tr2,2, /, Tr2,m) on the output side. Gate electrodes of Tr2,1, Tr2,2, /, Tr2,m are connected so that they are at the same electric potential. A gate electrode of Tr1 is connected to an input terminal (IN) 801 and gate electrodes of Tr2,1, Tr2,2, /, Tr2,m are connected to an output terminal (OUT) 802. Sources or drains of Tr2,1, Tr2,2, . . . , Tr2,m are connected respectively so that they are at the same electric potential. A connecting point between the source or drain of Tr1 and the sources or drains of Tr2,1, Tr2,2, . . . , Tr2,m is connected to a constant current source 803. The gate electrodes of Tr2,1, Tr2,2, . . . , Tr2,m are connected to their sources or drains, which are opposite their sources or drains connected with the constant current source 803.

The current mirror circuit C1 has an N-channel TFT (Tr3) on the input side and N-channel TFTs (Tr4,1, Tr4,2, /, Tr4,m) on the output side. The source or drain of Tr3 and the sources or drains of Tr4,1, Tr4,2, . . . , Tr4,m are connected together, and their connecting point is connected to a constant electric potential source 806. A gate electrode of Tr3 and gate electrodes of Tr4,1, Tr4,2, . . . , Tr4,m are connected together. The gate electrode of Tr3 and the gate electrodes of Tr4,1, Tr4,2, . . . , Tr4,m are connected to the source or drain of Tr3, which is opposite its source or drain connected with the sources or drains of Tr4,1, Tr4,2, . . . , Tr4,m (or connected with the constant electric potential source 806).

The source or drain of Tr1, which is opposite its source or drain connected with the constant current source 803, is connected to the source or drain of Tr3, which is opposite to the source or drain connected with the sources or drains of Tr4,1, Tr4,2, . . . , Tr4,m (or connected with the constant electric potential source 806). The sources or drains of Tr2,1, Tr2,2, . . . , Tr2,m, which are opposite their sources or drains connected with the constant current source 803, are connected with sources or drains of Tr4,1, Tr4,2, ..., Tr4,m, which are opposite their sources or drains connected with the source or drain of Tr3 (or connected with the constant electric potential source 806). The differential circuit B1 and the current mirror circuit C1 are connected in this manner.

Like the analog buffer circuit A1, the analog buffer circuits A2, /, An (A3 to An-1 are not shown) each have a differential circuit and a current mirror circuit.

The analog buffer circuit An has a differential circuit Bn and a current mirror circuit Cn.

The differential circuit Bn has a P-channel TFT (Tr4n-3) on the input side and P-channel TFTs (Tr4n-2,1, Tr4n-2,2, /, Tr4n-2,m) on the output side. Gate electrodes of Tr4n-2,1, Tr4n-2,2, ..., Tr4n-2,m are all connected so that they are at the same electric potential. A gate electrode of Tr4n-3 is connected to an input terminal (IN) 801 and gate electrodes of Tr4n-2,1, Tr4n-2,2, ..., Tr4n-2,m are connected to an output terminal (OUT) 802. Sources or drains of Tr4n-2,1, Tr4n-2,2, ..., Tr4n-2,m are connected so that they are at the same electric potential. A connecting point between the source or drain of Tr4n-3 and the sources or drains of Tr4n-2,1, Tr4n-2,2, ..., Tr4n-2,m is connected to a constant current source 805. The gate electrodes of Tr4n-2,1, Tr4n-2,2, ..., Tr4n-2,m are connected to their sources or drains, which are opposite their sources or drains connected with the constant current source 805.

The current mirror circuit Cn has an N-channel TFT (Tr4n-1) on the input side and N-channel TFTs (Tr4n,1, Tr4n,2, ..., Tr4n,m) on the output side. The source or drain of Tr4n-1 and the sources or drains of Tr4n,1, Tr4n,2, ..., Tr4n,m are connected together, and their connecting point is connected to the constant electric potential source 806. The gate electrode of Tr4n-1 and the gate electrodes of Tr4n,1, Tr4n,2, ..., Tr4n,m are connected together. The gate electrode of Tr4n-1 and the gate electrodes of Tr4n,1, Tr4n,2, Tr4n,m are connected to the source or drain of Tr4n-1, which is opposite its source or drain connected to the sources or drains of Tr4n,1, Tr4n,2, ..., Tr4n,m (or connected to the constant electric potential source 806).

The source or drain of Tr4n-3, which is opposite its source or drain connected with the constant current source 805, is connected to the source or drain of Tr4n-1, which is opposite its source or drain connected with the sources or drains of Tr4n,1, Tr4n,2, ..., Tr4n,m (or connected with constant electric potential source 806). The sources or drains of Tr4n-2,1, Tr4n-2,2, ..., Tr4n-2,m, which are opposite their sources or drains connected with the constant current source 805, are connected to the sources or drains of Tr4n,1, Tr4n,2, ..., Tr4n,m, which are opposite their sources or drains connected with Tr4n-1 (or connected with the constant electric potential source 806). The differential circuit Bn and the current mirror circuit Cn are connected in this manner.

The circuit configurations of the analog buffers A2 to An-1 (neither shown) are similar to that of the analog buffer A1 or An.

One side of all constant current sources is connected to the constant electric potential source 806 as shown.

In this embodiment the channel width of the P-channel TFTs forming the differential amplifier is 30 µm. The channel width of the N-channel TFTs forming the current mirror circuit is 30 µm. While the channel widths of individual TFTs in this embodiment are set at 30 µm, they need only to be 100 µm or less (preferably 90 µm or less).

The operation of the analog buffer circuit of this embodiment will be described. When the electric potential of the input terminal falls, most of the current of the constant current source flows into the P-channel TFTs of the differential circuit on the input side and into the input of the current mirror circuit. The number of TFTs on the output side of the current mirror circuit is n times that on the input side, so that a current n times the constant current source can be drawn in from the output terminal, which in turn allows the source signal line connected to the output terminal to be driven at high speed. When the electric potential at the input terminal is almost equal to that at the output terminal, the current of the constant current source is shunted to the output side TFTs and the input side TFTs. In this case, because the ratio in the number of TFTs in the differential circuit between the output side and the input side is 1:n and because the ratio in the number of TFTs in the current mirror circuit between the output side and the input side is 1:n, the electric potential of the input terminal and the output terminal are not affected by the number of TFTs.

The polarities of the thin-film transistors used in the differential circuit are opposite to those used in the current mirror circuit. While in this embodiment the differential circuit uses P-channel thin-film transistors and the current mirror circuit uses N-channel thin-film transistors, their polarities may be reversed but they do not operate if their polarities are the same.

The active matrix liquid crystal display having the analog buffer circuit of this embodiment can be manufactured according to the manufacturing method of the embodiment 1. The manufacturing method is not limited to that of the embodiment 1.

In the manufacturing method, when the semiconductor film is to be made polycrystalline by a linear laser beam and the analog buffer of the invention is used, the differential circuits B1–Bn are arranged so that they are included in the same pulse of the linear laser beam and also the current mirror circuits C1–Cn are arranged so that they are included in the same pulse of the linear laser beam. The semiconductor film made polycrystalline by the same pulse of the linear laser pulse is known to have small characteristic variations. This arrangement can further minimize the characteristic variations of the analog buffer circuit. Further, it is also possible to arrange both the differential circuits B1–Bn and the current mirror circuits C1–Cn so that they are included in the same pulse of the linear laser beam.

(Embodiment 3)

This embodiment explains one example arrangement of TFTs when the analog buffer circuit of this invention (including embodiment 1 and 2) is used in an active matrix semiconductor display (typically, liquid crystal display).

Figure 9:
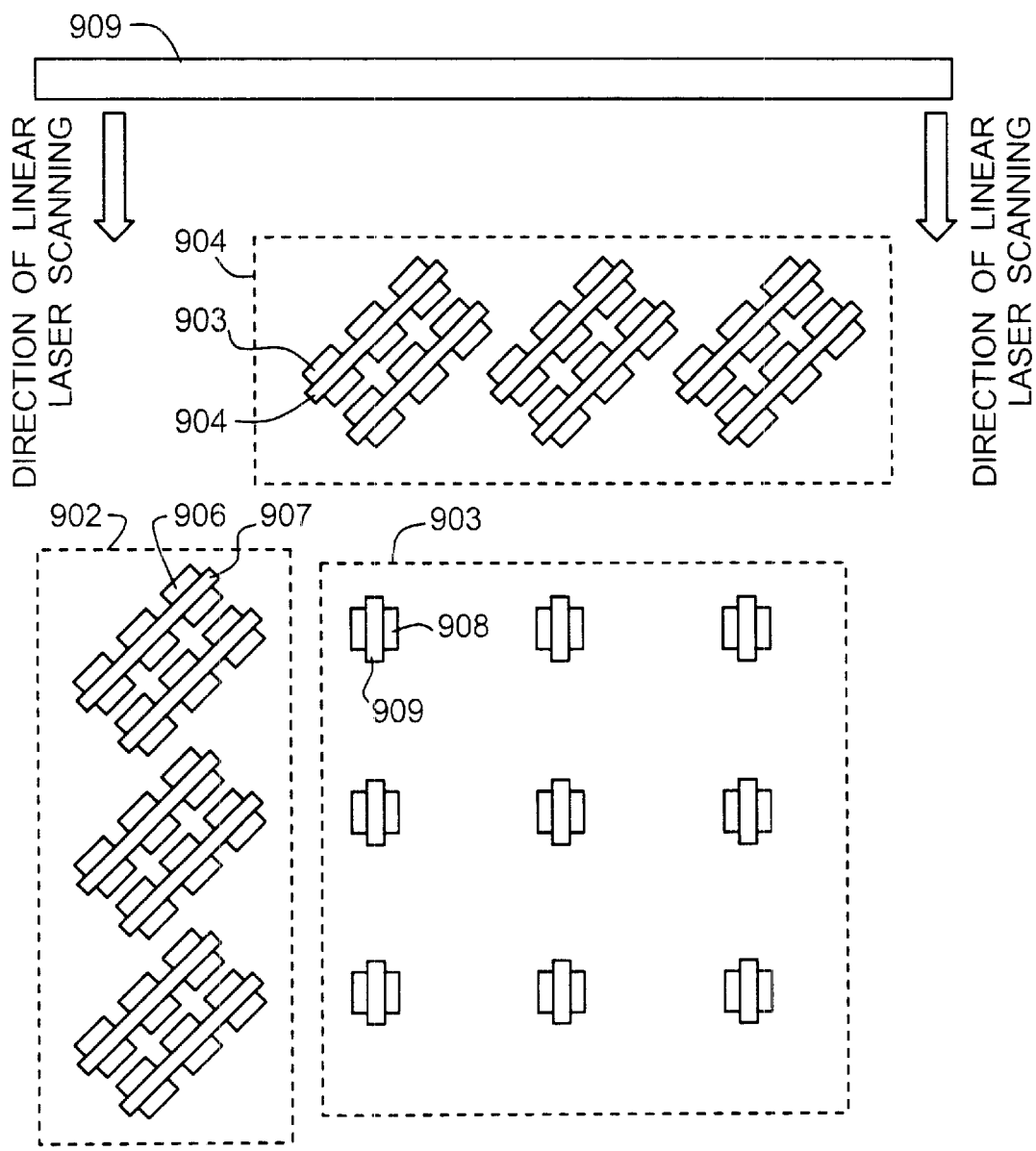
FIG. 9 is a diagram showing an example arrangement of TFTs that form an active matrix liquid crystal display having an analog buffer circuit of the invention.

FIG. 9 schematically shows a plurality of TFTs that form an active matrix liquid crystal display having the analog buffer circuit of this invention. Denoted 901 is a gate signal line side driving circuit having the analog buffer of the invention, 902 a source signal line side driving circuit, and 903 a pixel matrix circuit. Designated 904, 906 and 908 are semiconductor thin films that form TFTs, and 905, 907 and 909 are gate electrodes. The shape of the linear laser beam is schematically shown as 910. In the figure, the direction of linear laser scanning is shown by arrows.

Although in this embodiment the direction of the active layer, i.e., the direction of carrier movement, is inclined to the scan direction of the linear laser (at 45 degrees in this embodiment) as described above, it only needs to be arranged at inclination and may be set at any other angle than 45 degrees. In this case, too, the differential circuit B1–Bn are arranged in the same pulse of the linear laser beam and also the current mirror circuits C1–Cn are arranged in the same pulse of the linear laser beam. It is also possible to arrange both the differential circuits B1–Bn and the current mirror circuits C1–Cn in the same pulse of the linear laser beam.

While in the figure gate electrodes are shown for ease of explanation, the actual process may form the gate electrodes after subjecting the semiconductor film to the laser processing (in the case of top gate type).

The active matrix liquid crystal display of this embodiment may be fabricated using a known manufacturing method. For example, Japanese Patent Application Laid-Open Heisei 8-172049 filed by the applicant of this invention offers detailed descriptions. U.S. patent pending application Nos. 08/572,104 (filed on Dec. 14, 1995) and 09/010,486 (filed on Jan. 21, 1998) correspond to the Japanese patent application. The contents disclosed by these Japanese and U.S. patent applications are incorporated herein by reference.

The laser processing will be briefly explained in the following.

An amorphous silicon film formed over the glass substrate is crystallized. In this embodiment, the crystalline silicon film that was crystallized by heating is further subjected to irradiation of a linear laser beam to enhance the crystallinity.

The laser used for the manufacture of the active matrix liquid crystal display of this embodiment is a KrF excimer laser (wavelength: 248 nm, pulse width: 30 ns). It is possible to use other excimer lasers or other types of laser.

The laser beam is oscillated by an oscillator and sent via a total reflection mirror to an amplifier for amplification, from which it is introduced into an optical system via a total reflection mirror.

The beam pattern of the laser beam immediately before entering into the optical system is rectangular, about 3×2 cm$^2$. By passing this laser beam through the optical system, an elongate beam (linear beam) of about 10–30 cm long and about 0.1–1 cm wide can be obtained. The laser beam that has passed through the optical system has an energy of up to about 1000 mJ/shot.

By applying the processed laser beam to the substrate formed with a semiconductor thin film and by moving the substrate in one direction, a laser beam can be irradiated against the entire surface of the substrate. A stage that mounts the substrate to be irradiated with the laser beam is controlled by a computer to move at a desired speed in a direction perpendicular to the linear laser beam. In this way, the semiconductor thin film is crystallized.

As the number of pixels increases, the current capacity required of the analog buffer changes. In response to this change, how many smaller analog buffers should be used to construct each analog buffer also changes.

(Embodiment 4)

The active matrix liquid crystal display devices using the analog buffer of the invention, described in the embodiments 1 to 3, can deal with high precision, high resolution active matrix liquid crystal display devices, and the number of pixels can be increased to a level which corresponds to a future ATV (advanced TV). Therefore, this display can be used for the active matrix liquid crystal display having a resolution higher than XGA, such as 1920 horizontal×1280 vertical.

(Embodiment 5)

The active matrix liquid crystal displays described in the preceding embodiments 1 to 4 can be used for a transmission type active matrix liquid crystal display and also for a reflection type active matrix liquid crystal display. It is also possible to use as the liquid crystal material a thresholdless antiferroelectric liquid crystal. By using ferroelectric liquid crystal for the liquid crystal material and by using a special alignment film or by mixing a polymer in the liquid crystal layer, it is also possible to deal with a case where the memory effect of the ferroelectric liquid crystal is erased.

For example, it is possible to use liquid crystal materials disclosed in 1998, SID, Characteristics and Driving Scheme of Polymer-Stabilized Monostable FLCD Exhibiting Fast Response Time and High Contrast Ratio with Gray-Scale Capability by H. Furue et al., 1997, SID DIGEST, 841, A Full-Color Thresholdless Antiferroelectric LCD Exhibiting Wide Viewing Angle with Fast Response Time by T. Yoshida et al., or U.S. Pat. No. 5,594,569. The contents disclosed in these papers and patent are incorporated herein by reference.

Particularly, among thresholdless antiferroelectric liquid crystals and thresholdless antiferroelectric mixed liquid crystals made by mixing a ferroelectric liquid crystal material and an antiferroelectric liquid crystal material, there have been found liquid crystal materials whose drive electric potential is about ±2.5 V. The use of such thresholdless antiferroelectric mixed liquid crystals with low drive electric potentials enables the supply electric potential for an image signal sampling circuit to be kept in the range of around 5 V to 8 V. This is also effective when TFTs used have a relatively narrow width of LDD region (low concentration impurity region) (for example, 0–500 nm or 0–200 nm).

Here, a graph representing a light transmittivity characteristic of a thresholdless antiferroelectric mixed liquid crystal for the applied electric potential is shown in a figure. The transmission axis of the polarizer on the light-incoming side of the liquid crystal display is set almost parallel to the direction of a normal of the smectic layer of the thresholdless antiferroelectric mixed liquid crystal, in which the direction of a normal almost coinciding with the rubbing direction of the liquid crystal display. The transmission axis of the polarizer on the light exit side is set almost perpendicular to the transmission axis of the polarizer on the light-incoming side (a crossed-Nicols arrangement). It is understood that the use of a thresholdless antiferroelectric mixed liquid crystal allows a gray-scale representation with the applied electric potential-transmittivity characteristic as shown in the graph.

The thresholdless antiferroelectric mixed liquid crystals generally have a high level of spontaneous polarization and therefore a high dielectric constant. Hence, when the thresholdless antiferroelectric mixed liquid crystals are used in the liquid crystal display, the pixels are required to have a relatively large storage capacitor. It is therefore preferable to use a thresholdless antiferroelectric mixed liquid crystal with small spontaneous polarization. By using a sequential line driving method for the liquid crystal display, the period in which to write a gray-scale electric potential into the pixel (pixel feed period) can be elongated and thereby compensate for a small storage capacitor.

The use of the thresholdless antiferroelectric liquid crystals realizes a low electric potential driving and therefore reduces power consumption of the liquid crystal display.

While the embodiments 1 to 4 have described a case where a liquid crystal is used as a display medium, any other display medium can be used whose optical characteristics are modulated by applied electric potentials. For example, electroluminescent elements and electrochromics elements may be used as the display medium.

TFTs used in the embodiments 1 to 5 may be of top gate type or reverse stagger type.

(Embodiment 6)

The semiconductor displays of the embodiments 1 to 5 have a variety of uses. In this embodiment, semiconductor apparatus incorporating the active matrix semiconductor display will be explained.

Such semiconductor apparatus include video cameras, still cameras, projectors, head-mounted displays, car navigators, personal computers and portable information terminals (mobile computers and cellular phones). One such example is shown in FIG. 10.

Figure 10A:
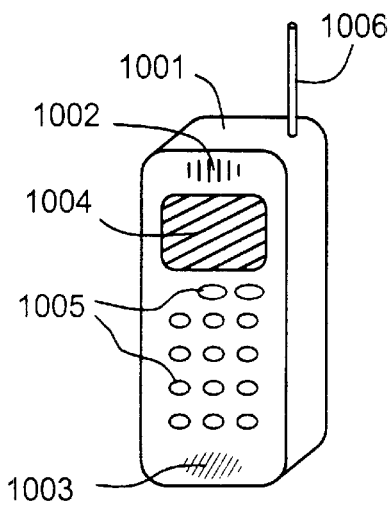
FIG. 10 is examples of semiconductor apparatus having a semiconductor display of the invention.

FIG. 10A shows a cellular phone, which includes a body 1001, a voice output section 1002, a voice input section 1003, a semiconductor display 1004, an operation switch 1005, and an antenna 1006.

Figure 10B:
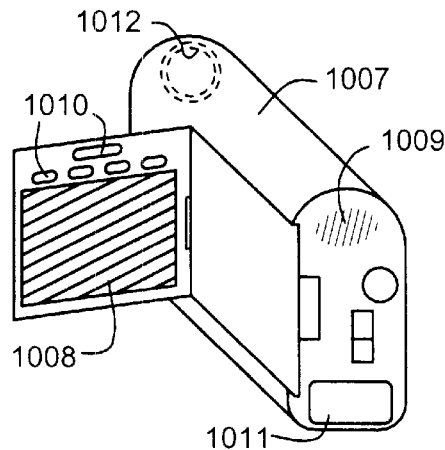

FIG. 10B shows a video camera, which includes a body 1007, a semiconductor display 1008, a voice input section 1009, an operation switch 1010, a battery 1011, and a picture receiving section 1012.

Figure 10C:
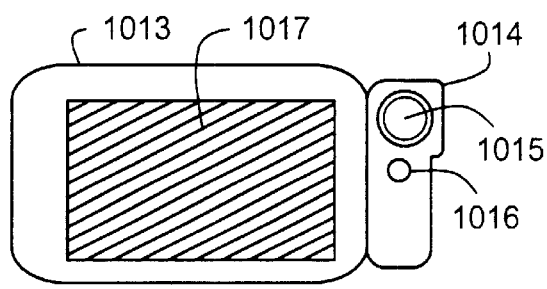

FIG. 10C shows a mobile computer, which includes a body 1013, a camera section 1014, a picture receiving section 1015, an operation switch 1016, and a semiconductor display 1017.

Figure 10D:
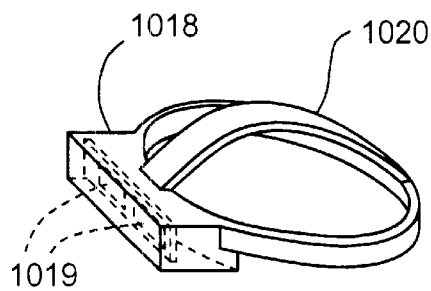

FIG. 10D shows a head-mounted display, which includes a body 1018, a semiconductor display 1019, and a band portion 1020.

Figure 10E:
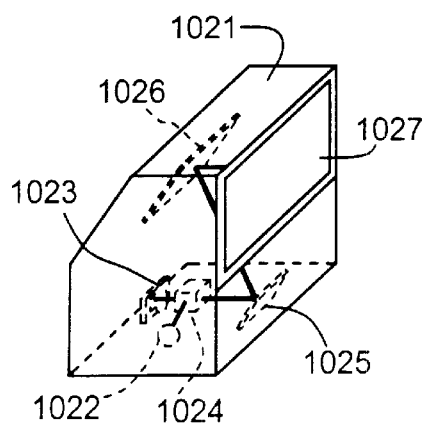

FIG. 10E shows a rear type projector, which includes a body 1021, a light source 1022, a semiconductor display 1023, a polarizing beam splitter 1024, reflectors 1025 and 1026, and a screen 1027. The rear type projector should preferably be able to change the angle of the screen with the body fixed according to the viewing position of audiences. Three semiconductor displays 1023 (corresponding to R, G and B beams respectively) can be used to realize a rear type projector with higher resolution and precision.

Figure 10F:
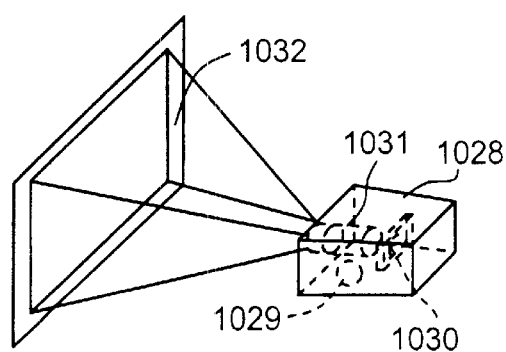
Figure 11:
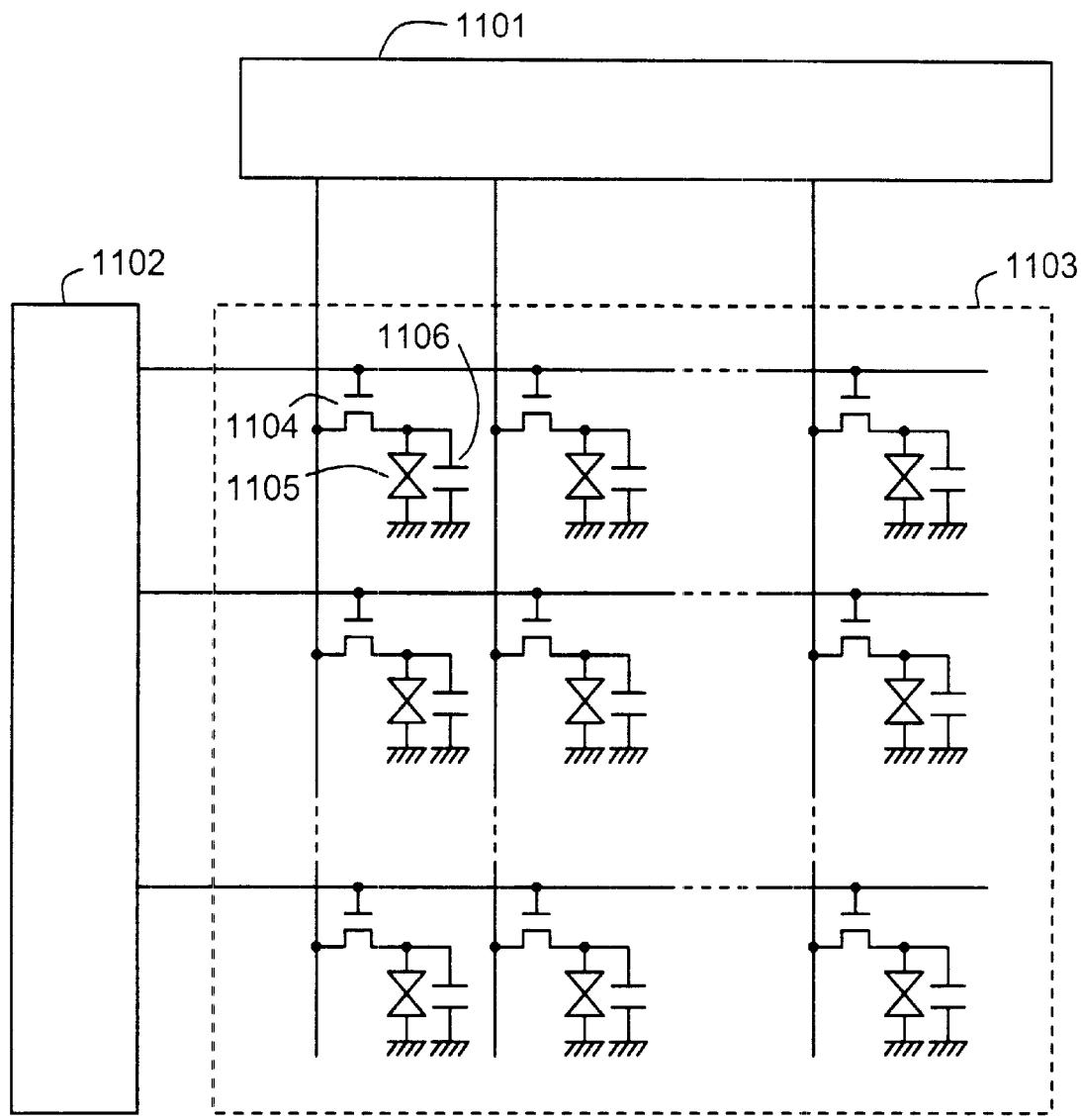
FIG. 11 is a schematic configuration of an active matrix liquid crystal display.
Figure 12:
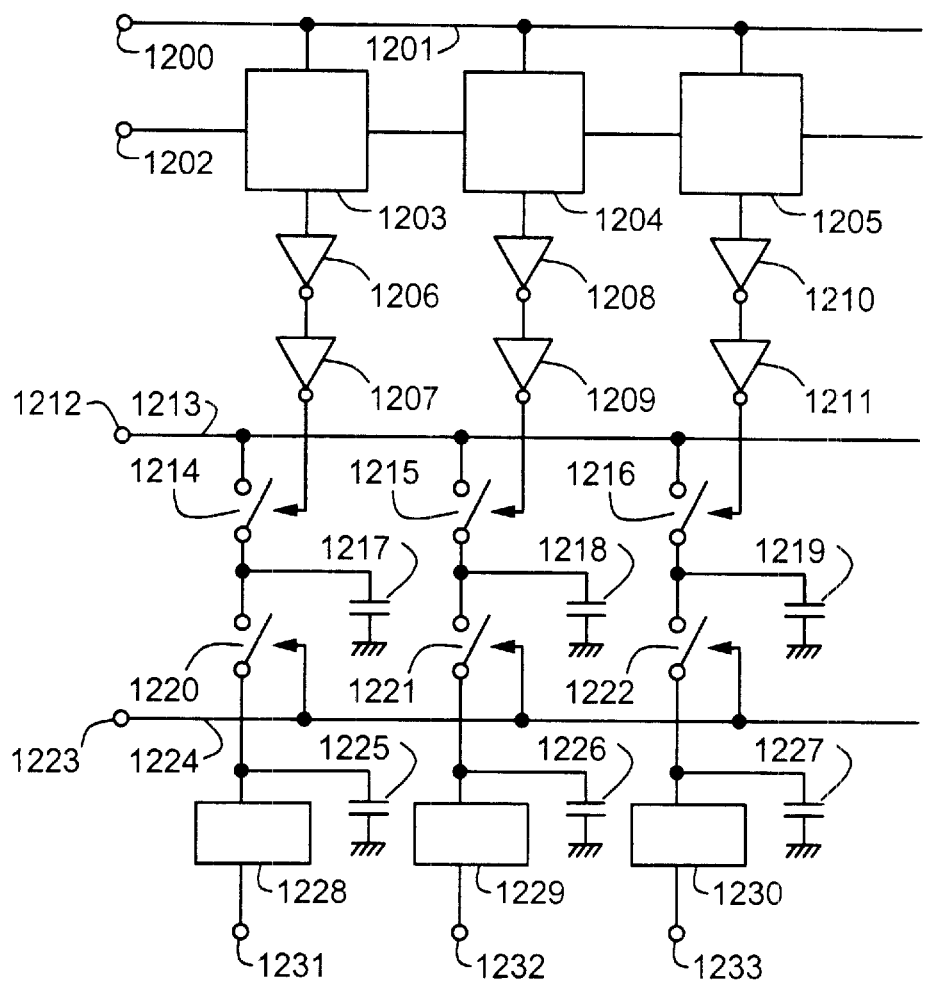
FIG. 12 is a schematic diagram showing an example of a source signal line side driving circuit in an active matrix liquid crystal display.
Figure 13:
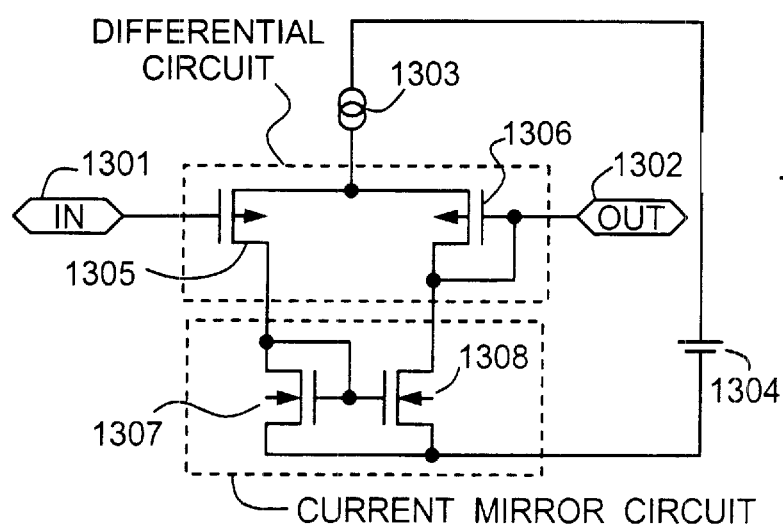
FIG. 13 is a circuitry of a conventional analog buffer.
Figure 14:
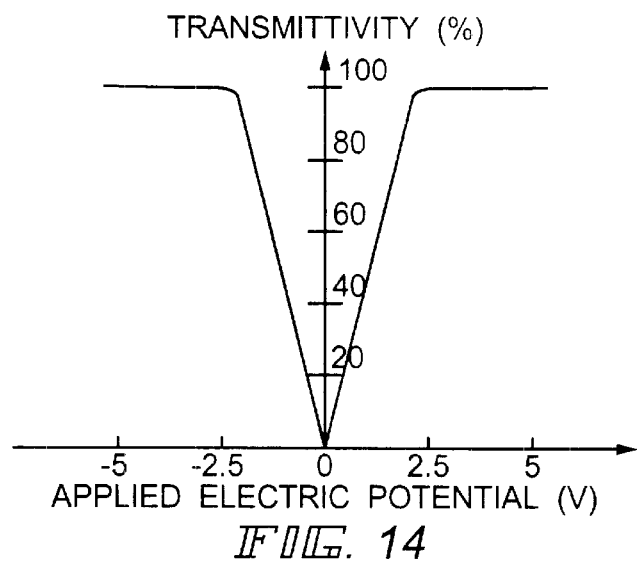
FIG. 14 is a graph showing an applied electric potential-transmittivity characteristic of a thresholdless antiferroelectric mixed liquid crystal.

FIG. 10F shows a front type projector, which includes a body 1028, a light source 1029, a semiconductor display 1030, an optical system 1031, and a screen 1032. Three semiconductor displays 1030 (corresponding to R, G and B beams respectively) can be used to realize a front type projector with higher resolution and precision.

[Embodiment 7]

This embodiment discloses other electronic apparatus utilizing displays implementing the present invention. Other electronic apparatus include digital cameras, head-mounted displays (goggle type display), and personal computers (notebook computers). Examples are shown in FIGS. 15A to 15C.

Figure 15B:
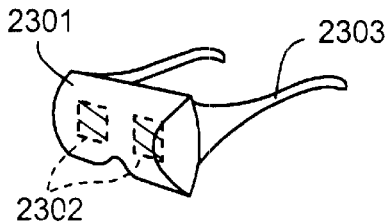
FIG. 15 is examples of electronic apparatus using a display of the invention.
Figure 15A:
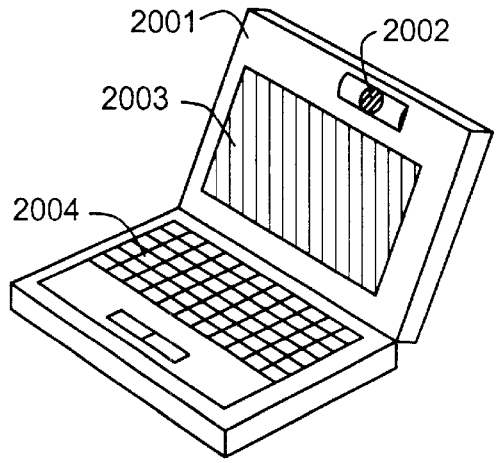

FIG. 15A shows a personal computer, which includes a body 2001, an image input section 2002, a display 2003, and a keyboard 2004. The present invention can be applied to the image input section 2002, display 2003 and signal control circuits.

FIG. 15B shows a goggle type display, which includes a body 2301, a display 2302, and an arm section 2303. The invention can be applied to the display 2302 and other signal control circuits.

Figure 15C:
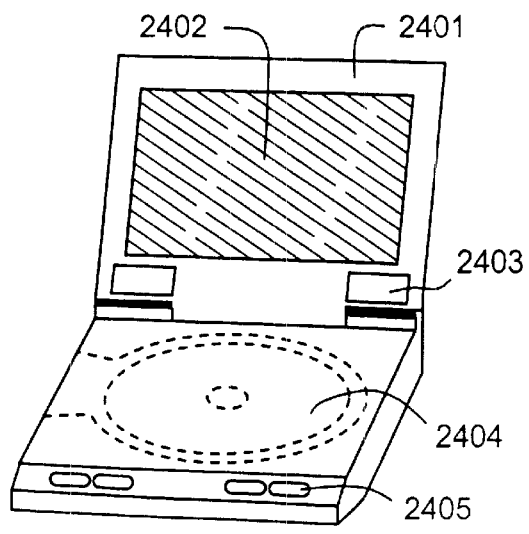

FIG. 15C shows a player that uses a recording medium that has recorded a program (simply referred to as a recording medium). The player includes a body 2401, a display 2402, a speaker section 2403, a recording medium 2404, and an operation switch 2405. This apparatus can use DVD (digital versatile disc) and CD as a recording medium to play music, movies and games and access the Internet. The invention can be applied to the display 2402 and signal control circuits.

Figure 15D:
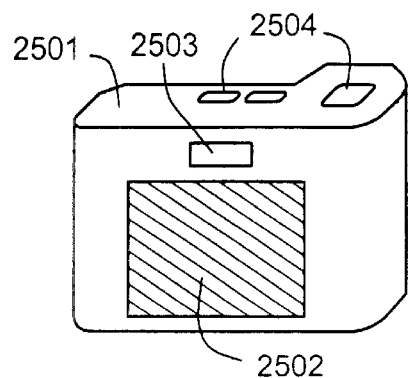

FIG. 15D is a digital camera, which includes a body 2501, a display 2502, a viewfinder section 2503, an operation switch 2504, and a picture receiving section (not shown). The invention can be applied to the display 2502 and signal control circuits. [0196]

The invention can minimize characteristic variations of the analog buffer, one of the important causes for image unevenness in the active matrix semiconductor display, and can realize an active matrix semiconductor display with high image quality.

We claim:

1. A thin-film transistor circuit comprising n analog buffer circuits (wherein n is a natural number equal to or greater than 2) connected in parallel, each of the n analog buffer circuits having a differential circuit and a current mirror circuit,
   wherein the n analog buffer circuits are inputted a signal, simultaneously.

2. A thin-film transistor circuit according to claim 1, wherein a plurality of thin-film transistors forming the differential circuit and a plurality of thin-film transistors forming the current mirror circuit are arranged within the same shot of a linear pulse laser beam.

3. A thin-film transistor circuit according to claim 1, wherein a direction of carrier movement in the plurality of thin-film transistors is about 45 degrees to a direction of scan of the linear pulse laser beam.

4. A thin-film transistor circuit comprising n analog buffer circuits, each of the n analog buffer circuits having:
   a differential circuit having a thin-film transistor on an input side and m thin-film transistors on an output side, the m thin-film transistors having gates, sources and drains thereof at their respective common voltages; and
   a current mirror circuit having a thin-film transistor on the input side and m thin-film transistors on the output side, the m thin-film transistors having gates, sources and drains thereof at their respective common voltages,
   wherein the n analog buffer circuits are inputted a signal, simultaneously.

5. A thin-film transistor circuit according to claim 4, wherein the input side thin-film transistor and the m output side thin-film transistors in the differential circuit of each of the n analog buffer circuits and the input side thin-film transistor and the m output side thin-film transistors in the current mirror circuit of each of the n analog buffer circuits are arranged within the same shot of a linear pulse laser beam, respectively.

6. A thin-film transistor circuit according to claim 4, wherein a direction of carrier movement in the thin-film transistors is about 45 degrees to a direction of scan of the linear pulse laser beam.

7. A semiconductor display comprising:
   a pixel matrix circuit;
   a source signal line side driving circuit; and
   a gate signal line side driving circuit;
   wherein the source signal line side driving circuit comprises at least a thin-film transistor circuit having n analog buffer circuits (wherein n is a natural number equal to or greater than 2) connected in parallel, each of the n analog buffer circuits having a differential circuit and a current mirror circuit,
   wherein the n analog buffer circuits are inputted a signal simultaneously.

8. A semiconductor display according to claim 7, wherein a plurality of thin-film transistors forming the differential circuit and a plurality of thin-film transistors forming the current mirror circuit are arranged within the same shot of a linear pulse laser beam, respectively.

9. A semiconductor display according to claim 7 or 8, wherein a direction of carrier movement in the plurality of thin-film transistors is about 45 degrees to a direction of scan of the linear pulse laser beam.

10. A semiconductor display comprising:

a pixel matrix circuit;

a source signal line side driving circuit; and a gate signal line side driving circuit;

wherein the source signal line side driving circuit comprises at least a thin-film transistor circuit comprising n analog buffer circuits, each of the n analog buffer circuits comprising:

a differential circuit having a thin-film transistor on an input side and m thin-film transistors on an output side, the m thin-film transistors having gates, sources and drains thereof at their respective common voltages; and a current mirror circuit having a thin-film transistor on the input side and m thin-film transistors on the output side, the m thin-film transistors having gates, sources and drains thereof at their respective common voltages, wherein the n analog buffer circuits are inputted a signal, simultaneously.

11. A semiconductor display according to claim 10, wherein the input side thin-film transistor and the m output side thin-film transistors in the differential circuit of each of the n analog buffer circuits and the input side thin-film transistor and the m output side thin-film transistors in the current mirror circuit of each of the n analog buffer circuits are arranged within the same shot of a linear pulse laser beam, respectively.

12. A semiconductor display according to claim 10, wherein a direction of carrier movement in the thin-film transistors is about 45 degrees to a direction of scan of the linear pulse laser beam.

13. A semiconductor display according to any one of claims 7, wherein a thresholdless antiferroelectric mixed liquid is used as a display medium.

14. A video camera using a semiconductor display of claim 7.

15. A still camera using a semiconductor display of claim 7.

16. A projector using a semiconductor display of claim 7.

17. A head-mounted display using a semiconductor display of claim 7.

18. A personal computer using a semiconductor display of claim 7.

19. A video camera using a semiconductor display of claim 10.

20. A still camera using a semiconductor display of claim 10.

21. A projector using a semiconductor display of claim 7.

22. A head-mounted display using a semiconductor display of claim 10.

23. A personal computer using a semiconductor display of claim 10.

24. A player for playing DVD using a semiconductor display of claim 7.

25. A player for playing DVD using a semiconductor display of claim 10.

26. A thin-film transistor circuit according to claim 2, wherein a direction of carrier movement in the plurality of thin-film transistors is about 45 degrees to a direction of scan of the linear pulse laser beam.

27. A thin-film transistor circuit according to claim 5, wherein a direction of carrier movement in the thin-film transistors is about 45 degrees to a direction of scan of the linear pulse laser beam.

28. A thin-film transistor circuit according to claim 11, wherein a direction of carrier movement in the thin-film transistors is about 45 degrees to a direction of scan of the linear pulse laser beam.

29. A semiconductor display according to claim 8, wherein a thresholdless antiferroelectric mixed liquid is used as a display medium.

30. A semiconductor display according to claim 9, wherein a thresholdless antiferroelectric mixed liquid is used as a display medium.

31. A semiconductor display according to claim 10, wherein a thresholdless antiferroelectric mixed liquid is used as a display medium.

32. A semiconductor display according to claim 11, wherein a thresholdless antiferroelectric mixed liquid is used as a display medium.

33. A semiconductor display according to claim 12, wherein a thresholdless antiferroelectric mixed liquid is used as a display medium.

34. A thin-film transistor circuit comprising n analog buffer circuits (wherein n is a natural number equal to or greater than 2) connected in parallel, each of the n analog buffer circuits having a differential circuit and a current mirror circuit, wherein the n analog buffer circuits are not connected in parallel through any switching element.

35. A semiconductor display comprising:

a pixel matrix circuit;

a source signal line side driving circuit; and a gate signal line side driving circuit;

wherein the source signal line side driving circuit comprises at least a thin-film transistor circuit having n analog buffer circuits (wherein n is a natural number equal to or greater than 2) connected in parallel, each of the n analog buffer circuits having a differential circuit and a current mirror circuit, wherein the n analog buffer circuits are not connected in parallel through any switching element.

36. A semiconductor display comprising:

a pixel matrix circuit;

a source signal line side driving circuit; and a gate signal line side driving circuit;

wherein the source signal line side driving circuit comprises at least a thin-film transistor circuit comprising n analog buffer circuits, wherein the n analog buffer circuits are inputted a signal, simultaneously.

37. A semiconductor display comprising:

a pixel matrix circuit;

a source signal line side driving circuit; and a gate signal line side driving circuit;

wherein the source signal line side driving circuit comprises at least a thin-film transistor circuit comprising n analog buffer circuits, wherein the n analog buffer circuits are not connected in parallel through any switching element.

38. A semiconductor device according to claim 1, wherein the n analog buffer circuits are only connected in parallel through wirings.

39. A semiconductor device according to claim 4, wherein the n analog buffer circuits are only connected in parallel through wirings.

40. A semiconductor device according to claim 7, wherein the n analog buffer circuits are only connected in parallel through wirings.

41. A semiconductor device according to claim 10, wherein the n analog buffer circuits are only connected in parallel through wirings.

* * * * *